(12) United States Patent  
Fujimoto

(10) Patent No.: US 7,928,506 B2
(45) Date of Patent: Apr. 19, 2011

(54) SEMICONDUCTOR DEVICE AND METHOD FOR MANUFACTURING THE SAME

(75) Inventor: Hiroyuki Fujimoto, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 263 days.

(21) Appl. No.: 12/360,645

(22) Filed: Jan. 27, 2009

(65) Prior Publication Data

US 2009/0194813 A1 Aug. 6, 2009

(30) Foreign Application Priority Data

Feb. 1, 2008 (JP) ................................. 2008-022705

(51) Int. Cl.
*H01L 29/66* (2006.01)

(52) U.S. Cl. ........ 257/330; 438/173; 438/270; 438/268; 438/587; 438/586; 438/294; 257/E21.159; 257/E21.24; 257/E21.3; 257/E21.41; 257/302; 257/754; 257/E29.266; 257/E21.45; 257/E29.262

(58) Field of Classification Search .................. 438/173, 438/270, 268, 587, 586, 294; 257/E21.159, 257/E21.24, E21.3, E21.41, 302, 754, E29.226, 257/E21.45, 330, E29.262
See application file for complete search history.

(56) References Cited

U.S. PATENT DOCUMENTS

| | | | | |
|---|---|---|---|---|
| 4,740,826 A | * | 4/1988 | Chatterjee | 257/334 |
| 5,006,909 A | * | 4/1991 | Kosa | 257/302 |
| 5,177,576 A | * | 1/1993 | Kimura et al. | 257/71 |
| 5,208,172 A | * | 5/1993 | Fitch et al. | 438/272 |
| 5,376,562 A | * | 12/1994 | Fitch et al. | 438/155 |
| 5,414,288 A | * | 5/1995 | Fitch et al. | 257/328 |
| 5,545,586 A | * | 8/1996 | Koh | 438/156 |
| 5,612,559 A | * | 3/1997 | Park et al. | 257/302 |
| 5,670,803 A | * | 9/1997 | Beilstein et al. | 257/278 |
| 6,034,389 A | * | 3/2000 | Burns et al. | 257/301 |
| 6,072,209 A | * | 6/2000 | Noble et al. | 257/296 |
| 6,107,660 A | * | 8/2000 | Yang et al. | 257/329 |
| 6,518,112 B2 | * | 2/2003 | Armacost et al. | 438/212 |
| 6,624,032 B2 | * | 9/2003 | Alavi et al. | 438/283 |
| 6,677,205 B2 | * | 1/2004 | Beintner | 438/270 |
| 6,699,750 B1 | * | 3/2004 | Rupp | 438/243 |
| 6,858,893 B2 | * | 2/2005 | Ishibashi | 257/302 |
| 7,056,783 B2 | * | 6/2006 | Layman et al. | 438/209 |
| 7,056,832 B2 | * | 6/2006 | Chang et al. | 438/725 |
| 7,141,476 B2 | * | 11/2006 | Dao | 438/283 |
| 7,696,559 B2 | * | 4/2010 | Arai et al. | 257/316 |
| 2003/0082875 A1 | * | 5/2003 | Lee | 438/243 |
| 2003/0151068 A1 | * | 8/2003 | Ishibashi | 257/200 |

(Continued)

FOREIGN PATENT DOCUMENTS

| | | |
|---|---|---|
| JP | 10-313100 A | 11/1998 |
| JP | 2002-94027 A | 3/2002 |
| JP | 2005-260014 A | 9/2005 |

*Primary Examiner* — Fernando L Toledo
*Assistant Examiner* — Ankush k Singal
(74) *Attorney, Agent, or Firm* — Sughrue Mion, PLLC

(57) ABSTRACT

The semiconductor device comprises a word line and a bit line. The word line comprises a gate electrode and a first metal interconnect. The first metal interconnect has contact with the gate electrode and extends into a region upper than a first impurity-diffused region in a first direction. The bit line comprises a connecting part and a second metal interconnect. The connecting part is formed so as to have contact with at least part of the side surface of the first impurity-diffused region. The second metal interconnect has contact with the connecting part and extends into a region lower than the semiconductor region in a second direction orthogonal to the first direction.

20 Claims, 21 Drawing Sheets

U.S. PATENT DOCUMENTS

| | | | |
|---|---|---|---|
| 2007/0210374 A1* | 9/2007 | Wu | 257/329 |
| 2007/0296045 A1* | 12/2007 | Tanaka | 257/396 |
| 2008/0048219 A1* | 2/2008 | Brar et al. | 257/288 |
| 2008/0099815 A1* | 5/2008 | Sun | 257/302 |
| 2009/0127586 A1* | 5/2009 | Gruening-von Schwerin | 257/205 |

* cited by examiner

FIG. 1
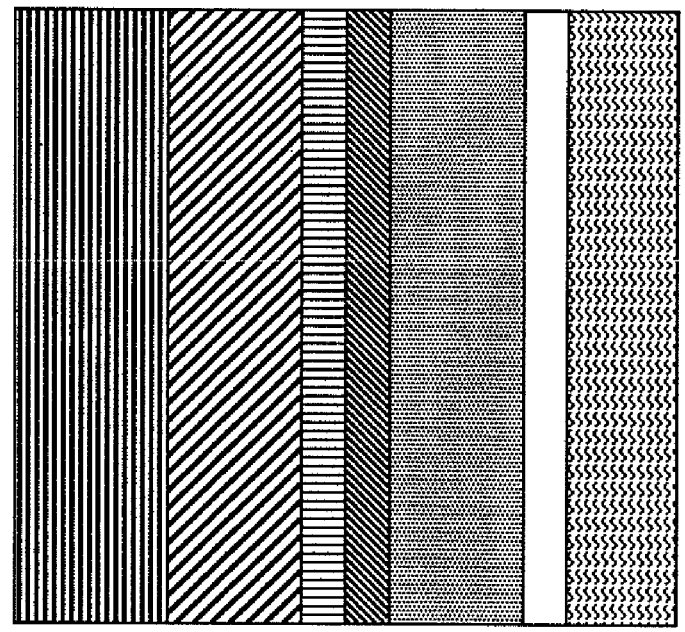
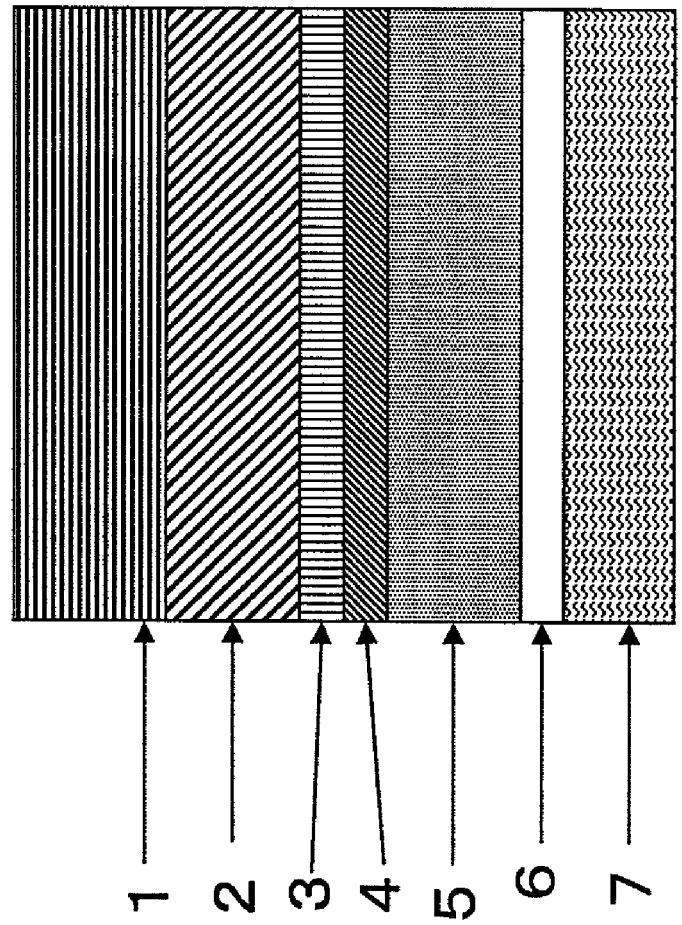

FIG. 3
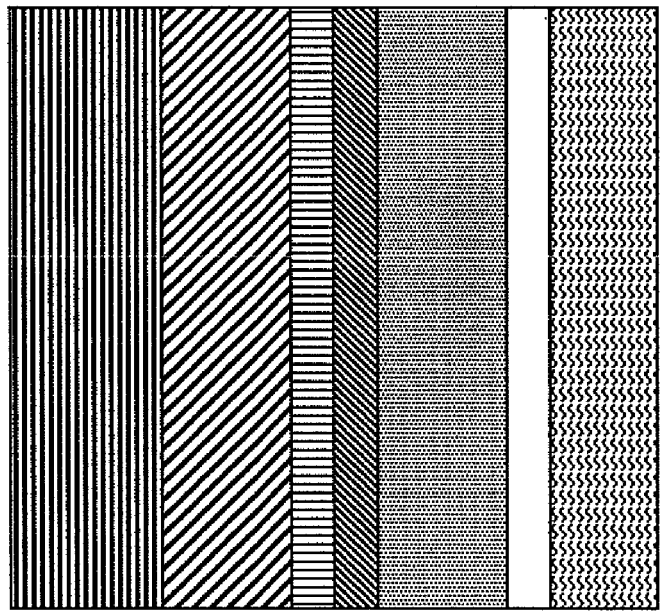
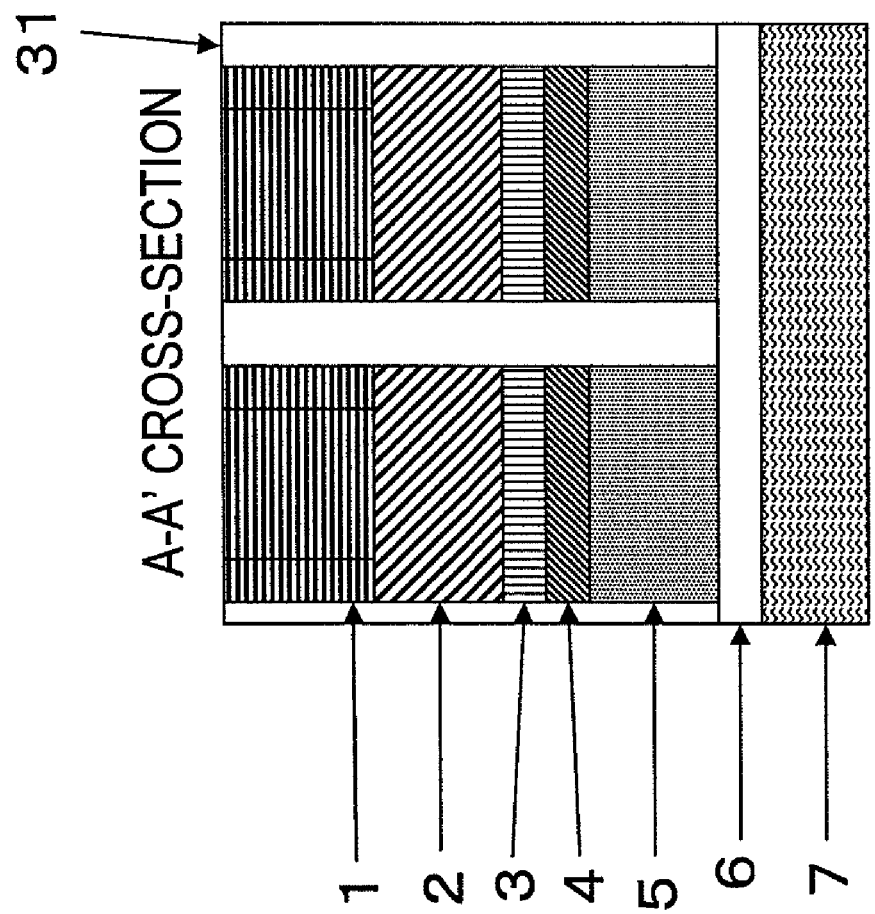

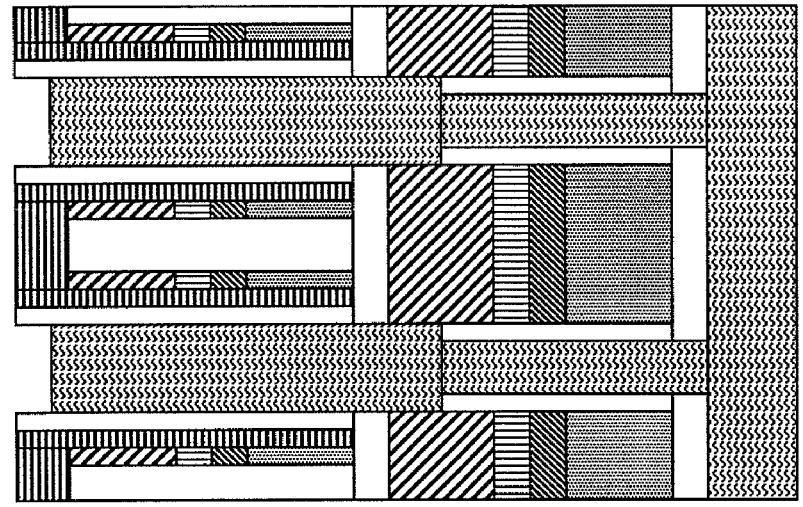
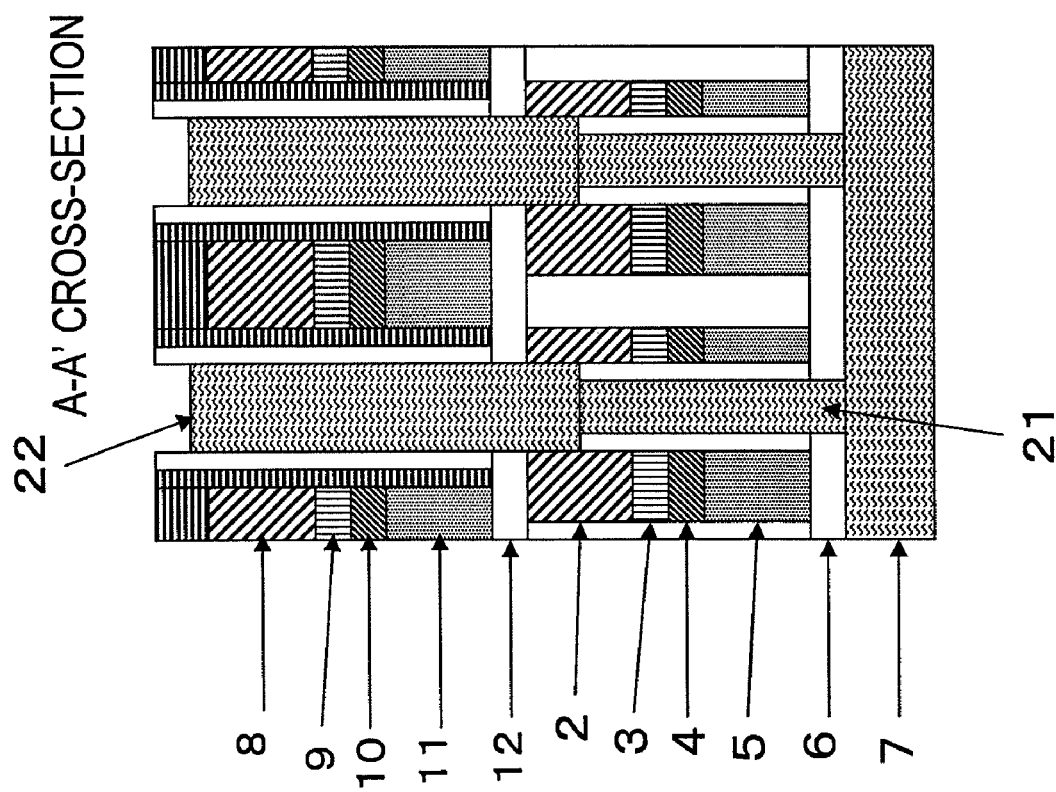
FIG. 11

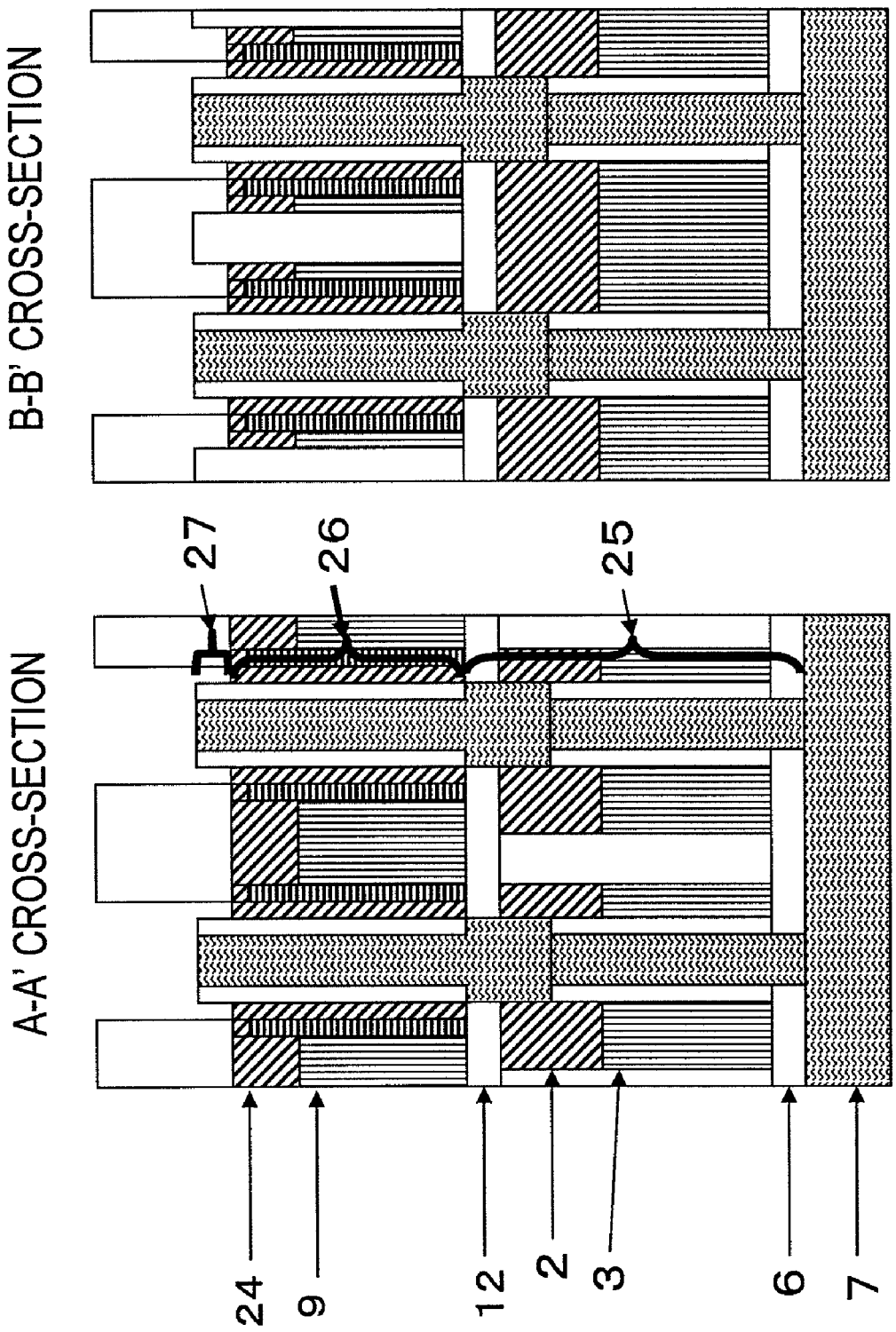

SEMICONDUCTOR DEVICE AND METHOD FOR MANUFACTURING THE SAME

This application is based upon and claims the benefit of priority from Japanese Patent Application No. 2008-022705, filed on Feb. 2, 2008, the disclosure of which is incorporated herein in its entirety by reference.

BACKGROUND OF THE INVENTION

1. Field of the Invention

The present invention relates to a semiconductor device and a method for manufacturing the semiconductor device.

2. Description of the Related Art

Along with the recent miniaturization of semiconductor devices, the current drive capability of a field effect transistor composing a semiconductor device tends to degrade. In order to enhance this current drive capability, there has been proposed a vertical field effect transistor including a three-dimensional structure in which a source region, a channel region and a drain region are vertically arranged. This vertical field effect transistor has the advantage that it is possible to achieve a dramatic enhancement in the current drive capability by completely depleting the channel region.

A conventionally used vertical field effect transistor includes a silicon column in which source/drain regions and a channel region are formed. This channel region is surrounded by a gate insulating film and a gate electrode. The source/drain regions are formed in the upper and lower portions of the silicon column. Thus, the vertical field effect transistor has a structure in which the channel region is completely covered with the source/drain regions.

In addition, this vertical field effect transistor is used in a wide variety of fields for its advantages. For example, the vertical field effect transistor is used as a transistor for a memory cell of a DRAM. Japanese Patent Laid-Open No. 2005-260014 discloses a semiconductor device including a plurality of memory cells disposed at intersection points where a plurality of word lines and a plurality of bit lines intersect. Each of these memory cells includes a vertical field effect transistor in which a channel region is formed in the depth direction of the memory cell, and a memory element the resistance value of which changes according to a temperature applied to either the upper or lower portion thereof.

The present inventor has recognized that the present invention provides a semiconductor device including a bit line and a word line and at least part of a bit line and a word line is made of a metal material.

SUMMARY OF THE INVENTION

In one embodiment, there is provided a semiconductor device, comprising:
a vertical field effect transistor;
a word line; and
a bit line,
wherein the vertical field effect transistor includes a first impurity-diffused region, a semiconductor region, and a second impurity-diffused region in this order, and includes a gate electrode formed so as to cover at least part of the side surface of the semiconductor region and a gate insulating film formed between the gate electrode and the semiconductor region,
the word line includes (a) the gate electrode, and (b) a first metal interconnect having contact with the gate electrode and extending into a region upper than the first impurity-diffused region in a first direction, and
the bit line includes (c) a connecting part formed so as to have contact with at least part of the side surface of the first impurity-diffused region, and (d) a second metal interconnect having contact with the connecting part and extending into a region lower than the semiconductor region in a second direction orthogonal to the first direction.

In another embodiment, there is provided a semiconductor device, comprising:
a semiconductor substrate;
a vertical field effect transistor formed on the semiconductor substrate,
wherein the vertical field effect transistor comprises a first impurity-diffused region, a channel region, and a second impurity-diffused region in this order from a top surface of the semiconductor substrate, and a gate electrode disposed facing to a side surface of the channel region with an intervention of a gate insulating film therebetween;
a word line including the gate electrode and a first metal interconnect having contact with the gate electrode, wherein the first metal interconnect is disposed facing to a side surface of the gate electrode with an intervention of an insulating film therebetween, and the word line extends in a first direction, and a level of the word line from the top surface of the semiconductor substrate is higher than a top surface of the first impurity-diffused region; and
a bit line including a second metal interconnect and a connecting part for contacting with the first impurity-diffused region, wherein the second metal interconnect contacts with the connecting part, the second metal interconnect is disposed facing to a side surface of the first impurity-diffused region with an intervention of an insulating film therebetween, the bit line extends in a second direction orthogonal to the first direction, and a level of the bit line from the top surface of the semiconductor substrate is lower than a bottom surface of the channel region.

In another embodiment, there is provided a method for manufacturing a semiconductor device including a vertical field effect transistor, the method comprising:
(1) forming a bit line including a second metal interconnect and a connecting part in this order on a substrate so as to extend in a second direction;
(2) forming an insulating layer on the entire surface of the substrate;
(3) forming a first metal interconnect and a first gate electrode material in this order on the insulating layer so as to extend in a first direction orthogonal to the second direction;
(4) forming an opening so as to penetrate the first gate electrode material, the first metal interconnect, the insulating layer, the connecting part and the second metal interconnect through to the substrate;
(5) forming a first impurity-diffused region within the opening so as to be electrically connected to the connecting part, and a semiconductor region on the first impurity-diffused region;
(6) forming a gate insulating film on a side surface of the semiconductor region within the opening;
(7) forming a gate electrode made of the first gate electrode material and a second gate electrode material by forming the second gate electrode material on the gate insulating film within the opening so as to be electrically connected to the first gate electrode material, and obtaining a word line composed of the gate electrode and the first metal interconnect; and
(8) converting an upper portion of the semiconductor region into a second impurity-diffused region.

BRIEF DESCRIPTION OF THE DRAWINGS

The above features and advantages of the present invention will be more apparent from the following description of certain preferred embodiments taken in conjunction with the accompanying drawings, in which:

FIG. 1 is a schematic view illustrating one step of a method for manufacturing a semiconductor device according to the present invention;

FIG. 3 is yet another schematic view illustrating one step of the method for manufacturing the semiconductor device according to the present invention;

FIG. 11 is still another schematic view illustrating one step of the method for manufacturing the semiconductor device according to the present invention;

FIG. 21 is a schematic view illustrating still another example of the semiconductor device according to the present invention.

Figure 2:
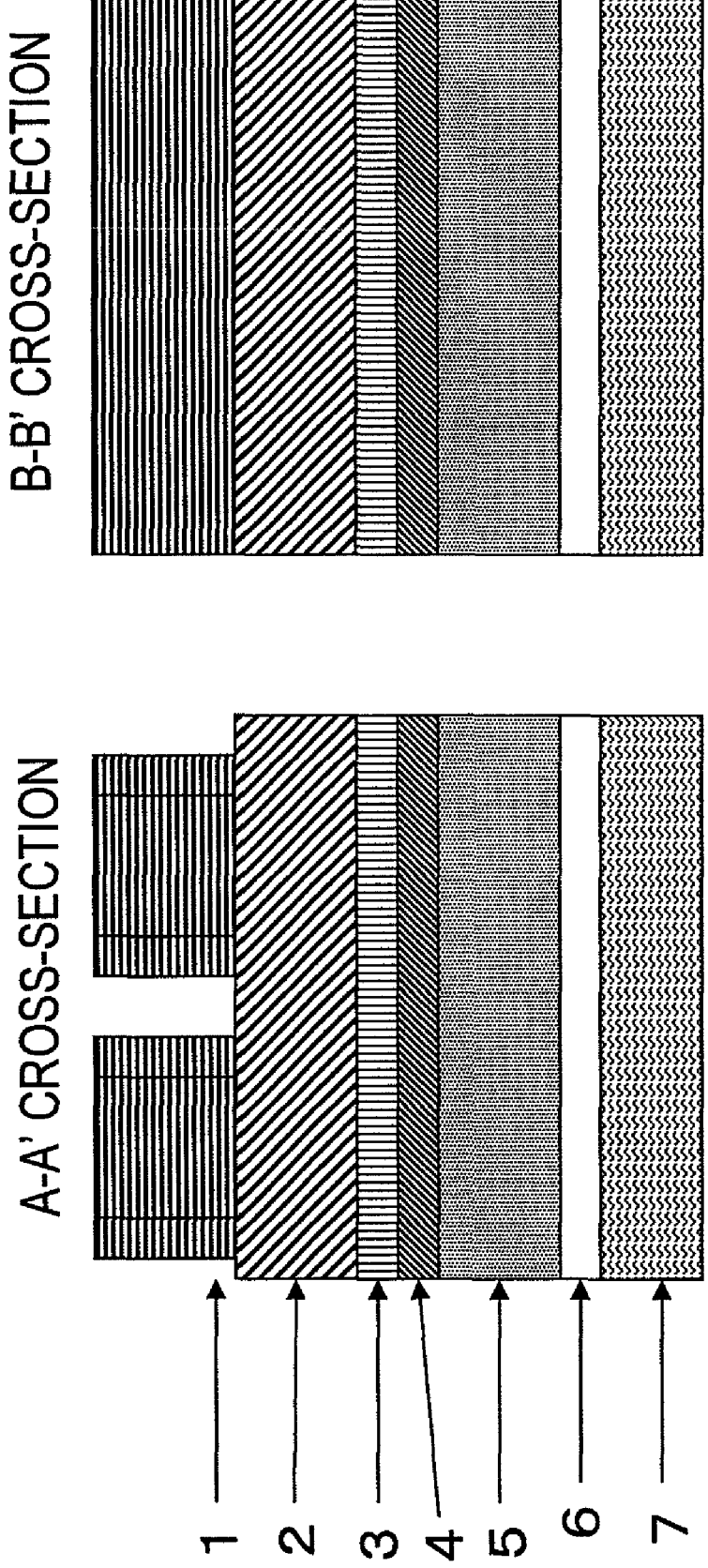
FIG. 2 is another schematic view illustrating one step of the method for manufacturing the semiconductor device according to the present invention.

In the drawings, numerals have the following meanings. 1: SiN film, 2: conductive polysilicon film (connecting part), 3: WSi film, 4: WN film, 5: W film, 6: silicon oxide film, 7: substrate, 8: conductive polysilicon film, 9: WSi film, 10: WN film, 11: W film, 12: silicon oxide film, 15: capacitor, phase-change material, 21: polysilicon portion, 22: polysilicon region, 23: gate insulating film, 24: gate electrode, 25: first impurity-diffused region, 26: semiconductor region, 27: second impurity-diffused region, 28: contact hole, 31: silicon oxide film, 32: silicon nitride film, 33: silicon oxide film, 34: silicon nitride film, 35: silicon nitride film, 36: silicon oxide film, 37: silicon oxide film, 38: contact plug, 39: interlayer insulating film.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device includes a vertical field effect transistor, a word line and a bit line. This word line includes a gate electrode and first metal interconnect, and first metal interconnect is made of a metal material. In addition, the bit line includes a connecting part and second metal interconnect, and second metal interconnect is made of a metal material. It is possible to reduce the resistivity of the bit line and the word line by forming a first and second metal interconnects from a metal material. As a result, it is possible to provide a semiconductor device having stable driving characteristics at low power.

The "metal material" for composing first and second metal interconnects denotes a conductive substance, including a metal element. For example, the metal material includes an elementary metal substance, a metal alloy, a metal nitride and a metal silicide.

Also, the "gate electrode" denotes a portion composed of a conductive material formed on a gate insulating film and portions continuous with this portion and composed of the same material. That is, any portions is defined as the gate electrode even if the portion is not present immediately above the gate insulating film, as long as the portion is communicated with (continuous with) the conductive material immediately above the gate insulating film.

Hereinafter, a description will be made of the present invention by referring to exemplary embodiments.

First Exemplary Embodiment

Semiconductor Device

Figure 17:
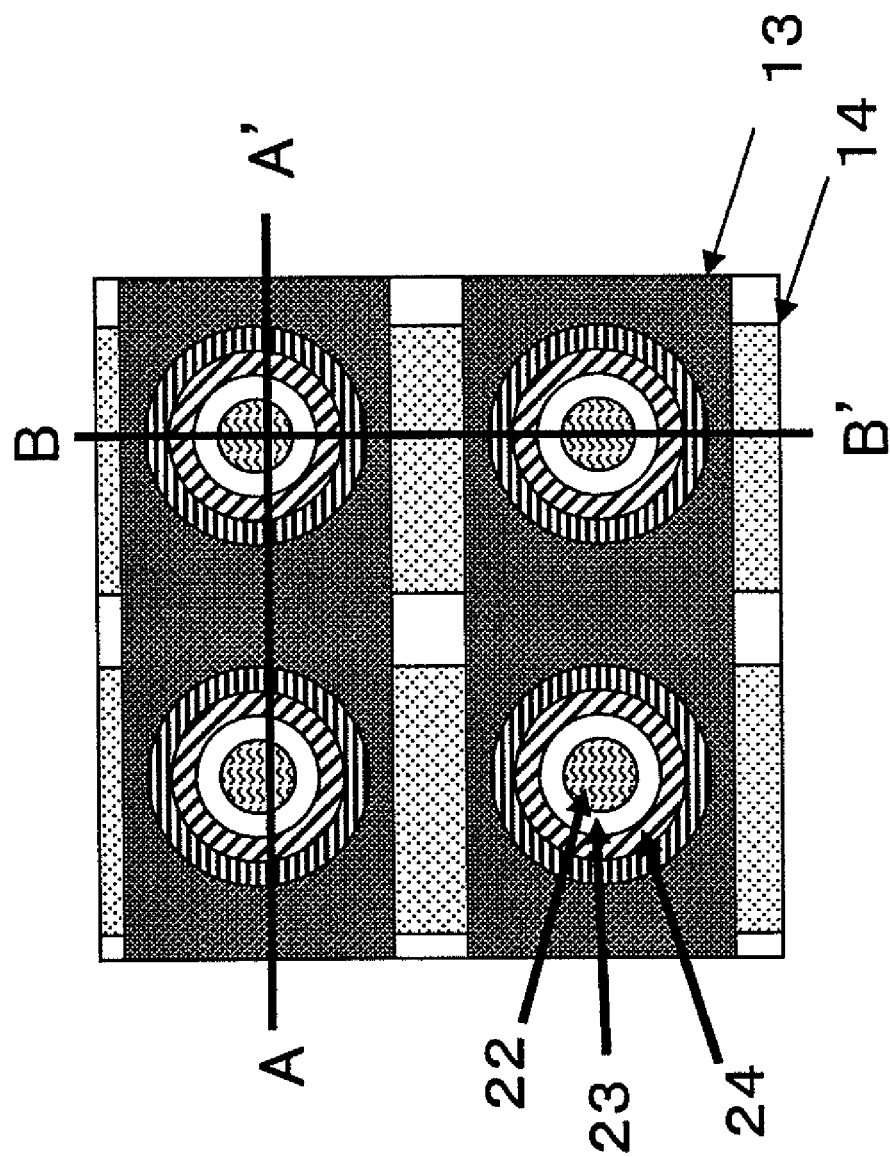
FIG. 17 is another schematic view illustrating one example of the semiconductor device according to the present invention.

FIG. 17 is a top view illustrating the semiconductor device of a first exemplary embodiment. As shown in FIG. 17, the semiconductor region of this semiconductor device has a cylindrical shape. Gate insulating film 23 and gate electrode 24 are formed so as to cover the side surface of this semiconductor region 22. This semiconductor region is formed with, in order from the bottom thereof, a first impurity-diffused region, a semiconductor region which serves as a channel region when in an ON state, and a second impurity-diffused region. In addition, the semiconductor region, the gate insulating film, the gate electrode, the first impurity-diffused region, and the second impurity-diffused region constitute a vertical field effect transistor.

A plurality of these vertical field effect transistors is arrayed in a first direction and in a second direction orthogonal to the first direction. The plurality of vertical field effect transistors arrayed in the first direction is electrically connected to one another by a word line composed of a gate electrode and first metal interconnect. In addition, the plurality of vertical field effect transistors arrayed in the second direction is electrically connected to one another by a bit line composed of a connecting part and second metal interconnect. The bit line and the word line are respectively formed in regions above and below an insulating layer and electrically insulated from each other.

Figure 16:
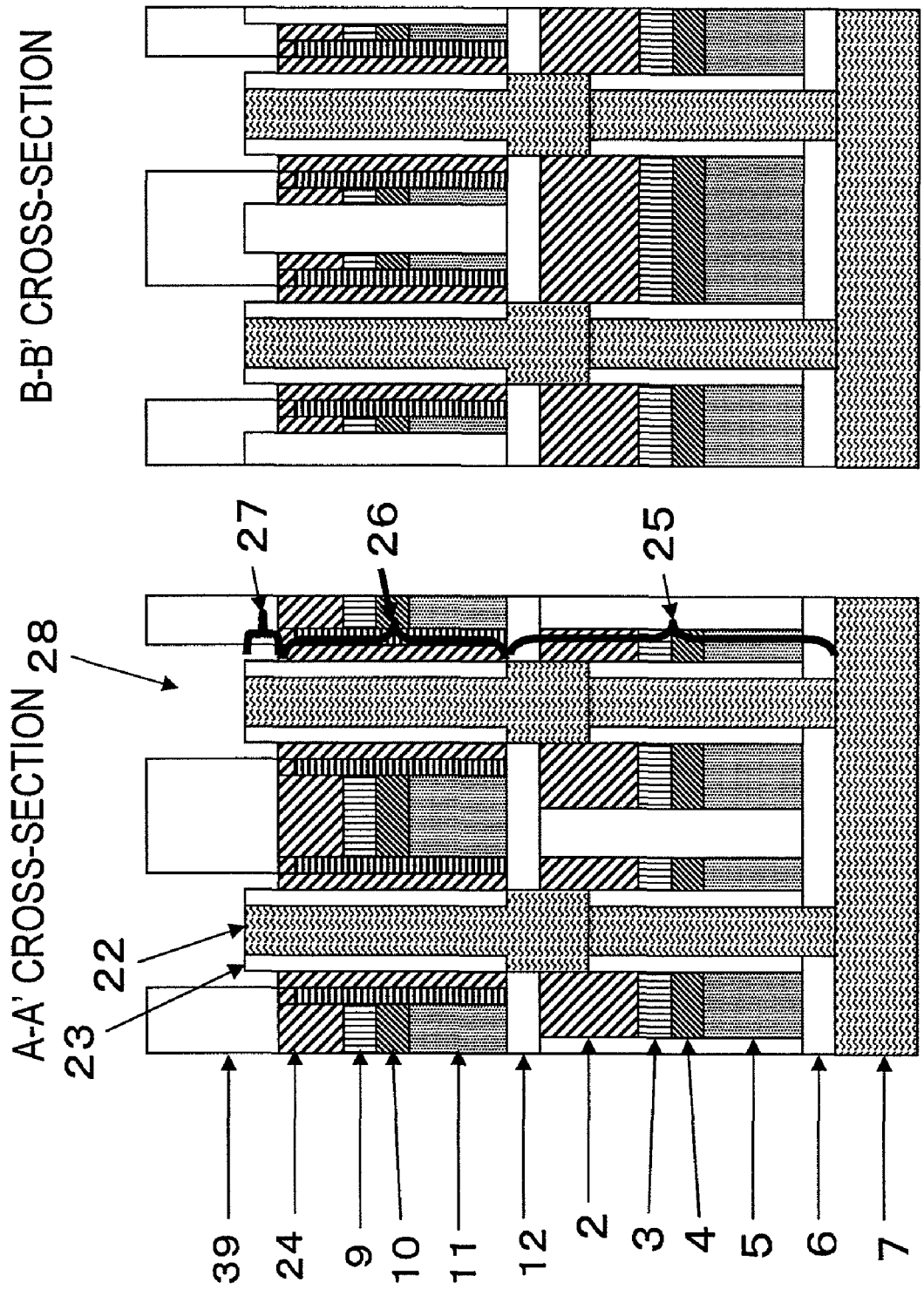
FIG. 16 is a schematic view illustrating one example of a semiconductor device according to the present invention.

FIG. 16 represents the A-A' and B-B' cross-sectional views of the semiconductor device illustrated in FIG. 17. As shown in FIG. 16, the semiconductor device of the present exemplary embodiment includes a vertical field effect transistor. This vertical field effect transistor includes, in order from the bottom thereof, first impurity-diffused region 25, semiconductor region 26, and second impurity-diffused region 27. On the side surface of this semiconductor region 25, there are provided gate insulating film 23 and gate electrode 24. When this vertical field effect transistor is in an ON state, semiconductor region 26 between first impurity-diffused region 25 and second impurity-diffused region 27 serves as a channel region, thereby causing a channel current to flow through this semiconductor region 26.

In addition, first metal interconnect (denoted by reference numerals 9, 10 and 11) extending in the first direction is formed in a region upper than insulating layer 12. First metal interconnect has contact with each gate electrode 24 of a plurality of vertical field effect transistors arrayed in the first direction, so as to electrically connect these gate electrodes 24 to one another. This first metal interconnect is composed of, in order from the bottom thereof, W (tungsten) layer 11, WN (tungsten nitride) layer 10 and WSi (tungsten silicide) layer 9. This first metal interconnect and the gate electrode are electrically insulated from each other through an insulating film.

Furthermore, second metal interconnect (denoted by reference numerals 3, 4 and 5) extending in the second direction is formed in a region lower than insulating layer 12. Second metal interconnect has contact with each connecting part 2 of a plurality of vertical field effect transistors arrayed in the second direction, so as to electrically connect these connecting parts 2 to one another. This second metal interconnect is composed of, in order from the bottom thereof, W (tungsten) layer 5, WN (tungsten nitride) layer 4 and WSi (tungsten silicide) layer 3. This second metal interconnect and the first impurity-diffused region are electrically insulated from each other through an insulating film.

Although in the present exemplary embodiment, the gate electrode is formed of conductive polysilicon, the material of the gate electrode is not limited to conductive polysilicon. Alternatively, it is possible to use a metal material such as an elementary metal substance, a metal alloy, a metal nitride, or a metal silicide. Likewise, the material of first metal interconnect is not limited to those mentioned in the present exemplary embodiment. Alternatively, it is possible to use a metal material such as an elementary metal substance, a metal alloy, a metal nitride, or a metal silicide.

For example, the below-described advantages are available if the gate electrode and first metal interconnect are formed of materials described in items (1) to (3) shown below.

(1) If the gate electrode is formed of conductive polysilicon and first metal interconnect is formed of an elementary metal substance, a metal alloy or a metal nitride, it becomes easy to control the threshold voltage of the vertical field effect transistor.

(2) If the gate electrode is formed of conductive polysilicon and first metal interconnect is formed of a metal silicide, it is possible to improve the heat resistance of the word line as a whole, compared with the case described in item (1) shown above.

(3) If the gate electrode and first metal interconnect are formed of an elementary metal substance, a metal alloy or a metal nitride, it is possible to reduce the electrical resistance of the word line to a minimum, compared with the cases described in items (1) and (2) shown above.

Although in the present exemplary embodiment, the connecting part is formed of conductive polysilicon, the material of the connecting part is not limited to conductive polysilicon. Alternatively, it is possible to use a metal material such as an elementary metal substance, a metal alloy, a metal nitride or a metal silicide. Likewise, the material of second metal interconnect is not limited to those mentioned in the present exemplary embodiment. Alternatively, it is possible to use a metal material such as an elementary metal substance, a metal alloy, a metal nitride or a metal silicide.

For example, the below-described advantages are available if the gate electrode and second metal interconnect are formed of materials described in items (1) to (3) shown below.

(1) If the connecting part is formed of conductive polysilicon and second metal interconnect is formed of an elementary metal substance, a metal alloy or a metal nitride, it is possible to prevent the metal material composing second metal interconnect from diffusing into the semiconductor region of the vertical field effect transistor by conductive polysilicon composing the connecting part. Accordingly, this material combination is effective when forming a vertical field effect transistor in which it is undesirable for any metal materials to be present in a channel region.

(2) If the connecting part is formed of conductive polysilicon and second metal interconnect is formed of a metal silicide, it is possible to improve the heat resistance of the bit line as a whole, compared with the case described in item (1) shown above.

(3) If the connecting part and second metal interconnect are formed of an elementary metal substance, a metal alloy or a metal nitride, it is possible to reduce the electrical resistance of the bit line to a minimum, compared with the cases described in items (1) and (2) shown above.

When using a metal silicide as the material of the gate electrode, the connecting part, and first and second metal interconnects, it is preferable to use at least one type of silicide selected from the group consisting of a tungsten silicide, a cobalt silicide, a nickel silicide, a titanium silicide, a molybdenum silicide and a chromium silicide. By using these metal silicides, it is possible to effectively reduce the electrical resistance.

The shape of the semiconductor region is not limited to a cylindrical shape. Alternatively, it is possible to use other various shapes, including a plasmatic shape and an amorphous shape extending in the thickness direction of the semiconductor region. In addition, connecting part 2 may be formed so as to have contact with at least part of the side surface of first impurity-diffused region 25. It is preferable, however, to form the connecting part so as to have contact with the entire side surface of first impurity-diffused region 25, in order to reduce the contact resistance.

Second metal interconnect may be formed so as to have contact with at least part of connecting part 2 and be electrically connected thereto. It is preferable, however, to increase the area of contact with connecting part 2 as much as possible, in order to reduce the contact resistance. In addition, second metal interconnect is typically insulated from first impurity-diffused region 25 through an insulating film or the like and is electrically connected only to connecting part 2.

Gate insulating film 23 and gate electrode 24 may be formed on at least part of the side surface of the semiconductor region except a portion thereof corresponding to second impurity-diffused region 27. It is preferable, however, to form gate insulating film 23 and gate electrode 24 on the entire side surface of the semiconductor region except a portion thereof corresponding to the second impurity-diffused region, in order to obtain a high channel current.

First metal interconnect may be formed so as to have contact with at least part of gate electrode 24 and be electrically connected thereto. It is preferable, however, to increase the area of contact with gate electrode 24 as much as possible, in order to reduce the contact resistance. In addition, first metal interconnect is typically insulated from the second impurity-diffused region through an insulating film or the like and is electrically connected only to gate electrode 24.

If the semiconductor device includes a plurality of vertical field effect transistors, connecting part 2 preferably extends so as to electrically connect first impurity-diffused regions 25 of the plurality of vertical field effect transistors in a second direction. In addition, each connecting part 2 may exist so as to electrically connect only to first impurity-diffused region 25 of each vertical field effect transistor. If each connecting part 2 is electrically connected only to first impurity-diffused region 25 of each vertical field effect transistor in this way, second metal interconnect extends in the second direction and electrically connects first impurity-diffused regions 25 of respective vertical field effect transistors to one another through respective connecting parts 2.

Likewise, if the semiconductor device includes a plurality of vertical field effect transistors, gate electrode 24 of each vertical field effect transistor may extend in the first direction and be made common to each other. Alternatively, gate electrodes 24 of respective vertical field effect transistors may be independent of each other. If gate electrodes 24 of respective vertical field effect transistors are independent of each other in this way, first metal interconnect extends in the first direction and electrically connects gate electrodes 24 of respective vertical field effect transistors to one another.

First impurity-diffused region 25 may be either a drain region or a source region. Likewise, second impurity-diffused region 27 may be either a drain region or a source region. Preferably, however, first impurity-diffused region 25 is a drain region and second impurity-diffused region 27 is a source region. In addition, the vertical field effect transistor may be either an N-type field effect transistor or a P-type field effect transistor.

Method for Manufacturing Semiconductor Device

FIGS. 1 to 17 are schematic views used to explain a method for manufacturing the semiconductor device of the first exemplary embodiment. Each figure illustrates portions corresponding to the A-A' and B-B' cross-sections of FIG. 17.

First, after preparing silicon semiconductor substrate 7, a surface thereof was thermally oxidized to form silicon oxide film 6. Then, W (tungsten) film 5, WN (tungsten nitride) film 4, WSi (tungsten silicide) film 3, conductive polysilicon film 2, and SiN (silicon nitride) film 1 were successively formed on silicon oxide film 6 in this order (FIG. 1).

The W (tungsten) film and the WN (tungsten nitride) film can be formed by, for example, a CVD method. The WSi (tungsten silicide) film can be formed by depositing a W (tungsten) film and an Si film and then letting the films undergo a silicidation reaction by heat treatment. The conductive polysilicon film can be formed using a DOPOS (Doped Polycrystalline Silicon) method. The SiN (silicon nitride) film can be formed by depositing an Si layer and then performing a nitridation treatment.

Next, after performing line-and-space lithography to form a resist mask (not illustrated), SiN (silicon nitride) film 1 was dry-etched using this resist mask as a mask, to form a mask pattern. After this, the resist mask was separated off. Then, a sidewall nitride film was grown (FIG. 2).

After this, conductive polysilicon film 2, WSi film 3, WN film 4 and W film 5 were dry-etched using the mask pattern formed of SiN film 1 as a mask and silicon oxide film 6 as an etching stopper, to form an opening so as to penetrate through these films. After this, silicon oxide film 31 was formed within the opening, and then a CMP treatment was performed on silicon oxide film 31 to planarize the silicon oxide film (FIG. 3).

Figure 4:
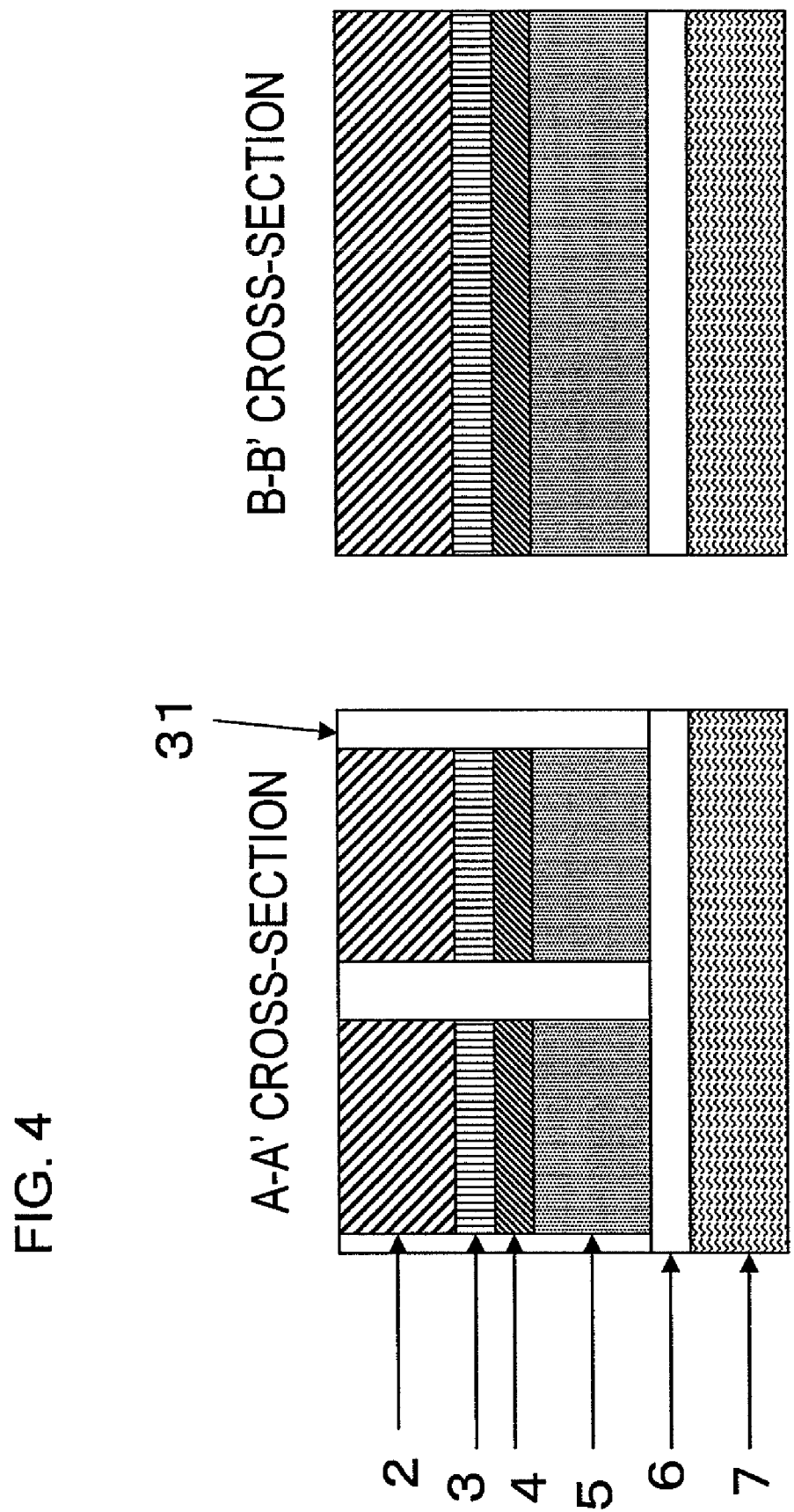
FIG. 4 is still another schematic view illustrating one step of the method for manufacturing the semiconductor device according to the present invention.

After this, silicon oxide film 31 was wet-etched partway, and then the mask pattern formed of silicon nitride film 1 was wet-etched, thereby removing this mask pattern (FIG. 4). In this way, it was possible to form a bit line including second metal interconnect (denoted by reference numerals 3, 4 and 5) and connecting part 2 in this order, so as to extend in the second direction (step (1)).

After this, silicon oxide film 12 (step (2)), W (tungsten) film 11, WN (tungsten silicide) film 10, WSi (tungsten silicide) film 9, conductive polysilicon film 8, and SiN (silicon nitride) film 32 were formed on the entire surface of the semiconductor device being manufactured. As the growth method of each film, the same method as illustrated in FIG. 1 was used.

Figure 5:
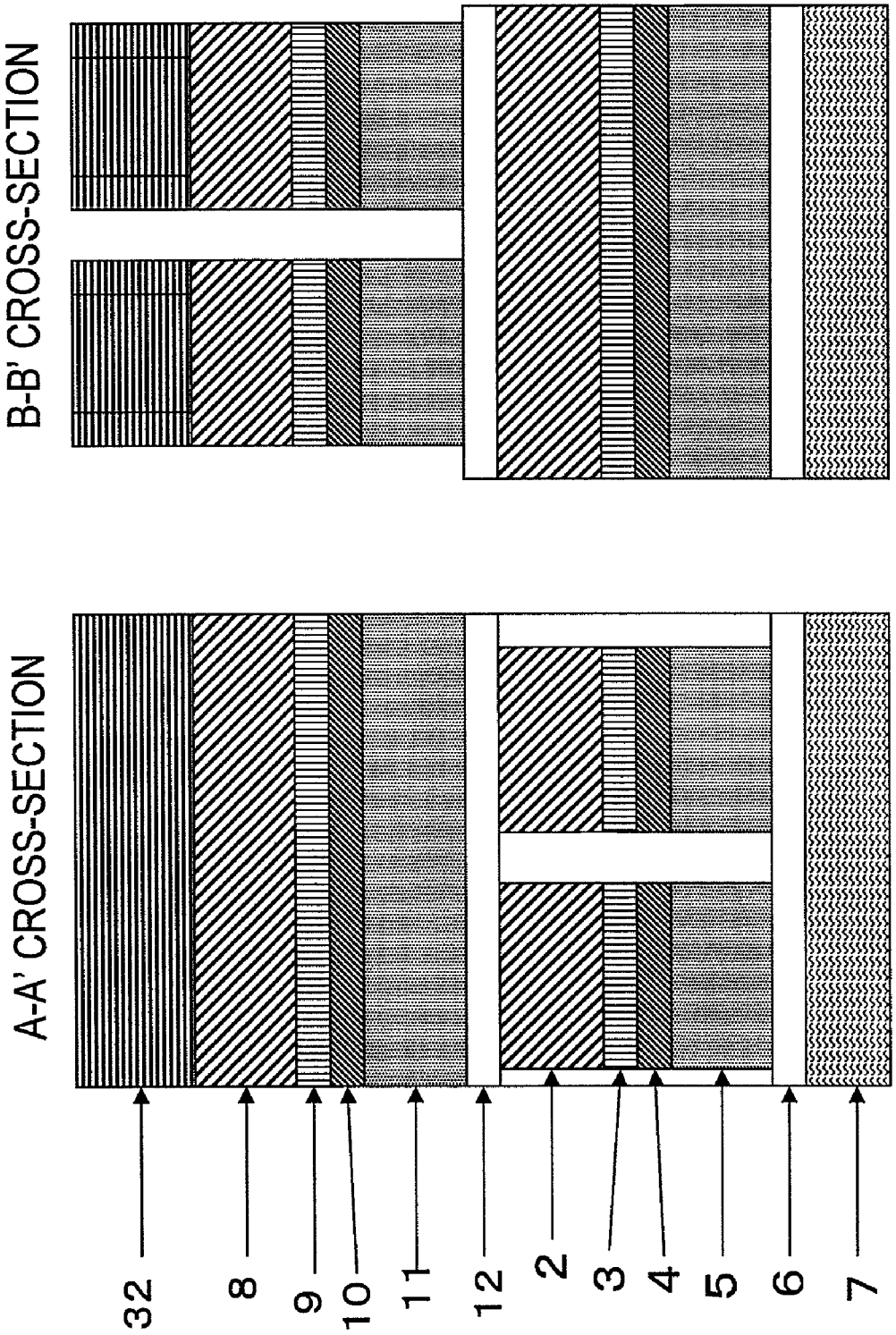
FIG. 5 is still another schematic view illustrating one step of the method for manufacturing the semiconductor device according to the present invention.
Figure 6:
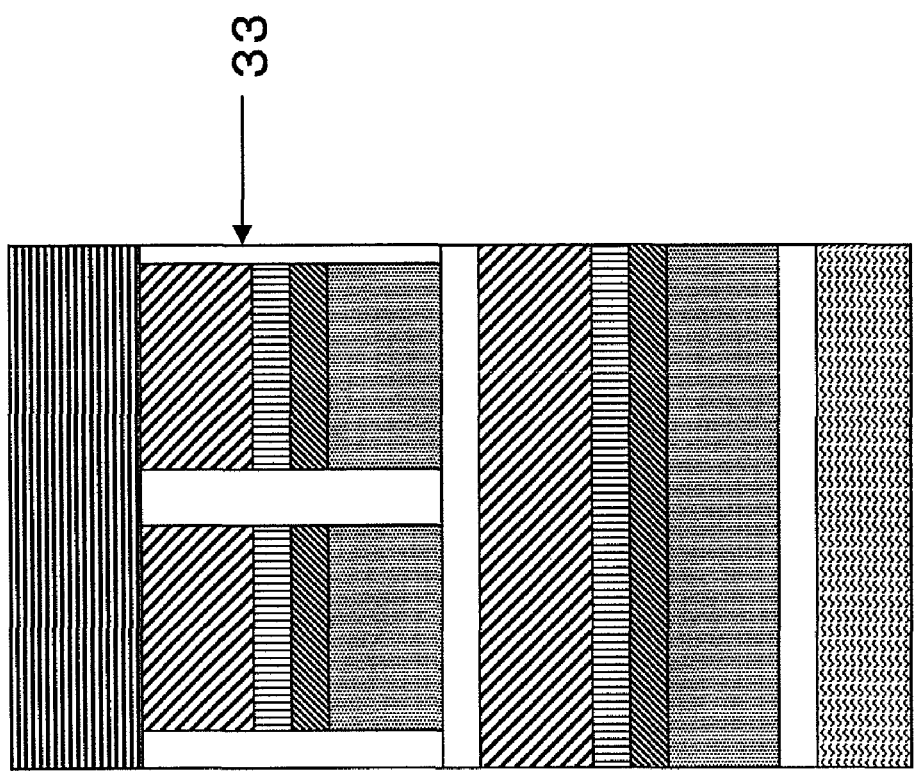
FIG. 6 is still another schematic view illustrating one step of the method for manufacturing the semiconductor device according to the present invention.

After this, there was formed, by line-and-space lithography, a resist mask (not illustrated) including a pattern of lines and spaces arrayed in a first direction orthogonal to the second direction. After this, SiN (silicon nitride) film 32 was dry-etched using this resist mask as a mask to form a mask pattern made of SiN. Then, the resist mask was separated off. After this, a sidewall formed of a silicon nitride film was grown and the silicon nitride film was etched back. Next, conductive polysilicon film 8, WSi film 9, WN film 10 and W film 11 were dry-etched using a mask pattern formed of SiN film 32 as a mask and silicon oxide film 12 as an etching stopper, to form an opening so as to penetrate through these films (FIG. 5). After this, silicon oxide film 33 was grown within the opening and then a CMP treatment was performed on silicon oxide film 33, thereby planarizing the silicon oxide film. In this way, it was possible to form first metal interconnect (denoted by reference numerals 9, 10 and 11) and conductive polysilicon layer 8 in this order, so as to extend in a first direction orthogonal to the second direction (step (3)). This conductive polysilicon layer 8 corresponds to first gate electrode material. After this, silicon oxide film 33 was wet-etched partway, and then silicon nitride film 32 was wet-etched to remove the mask pattern formed of silicon nitride film 32. Next, silicon nitride film 34 was formed once again on the entire surface of the semiconductor device being manufactured (FIG. 6).

Figure 7:
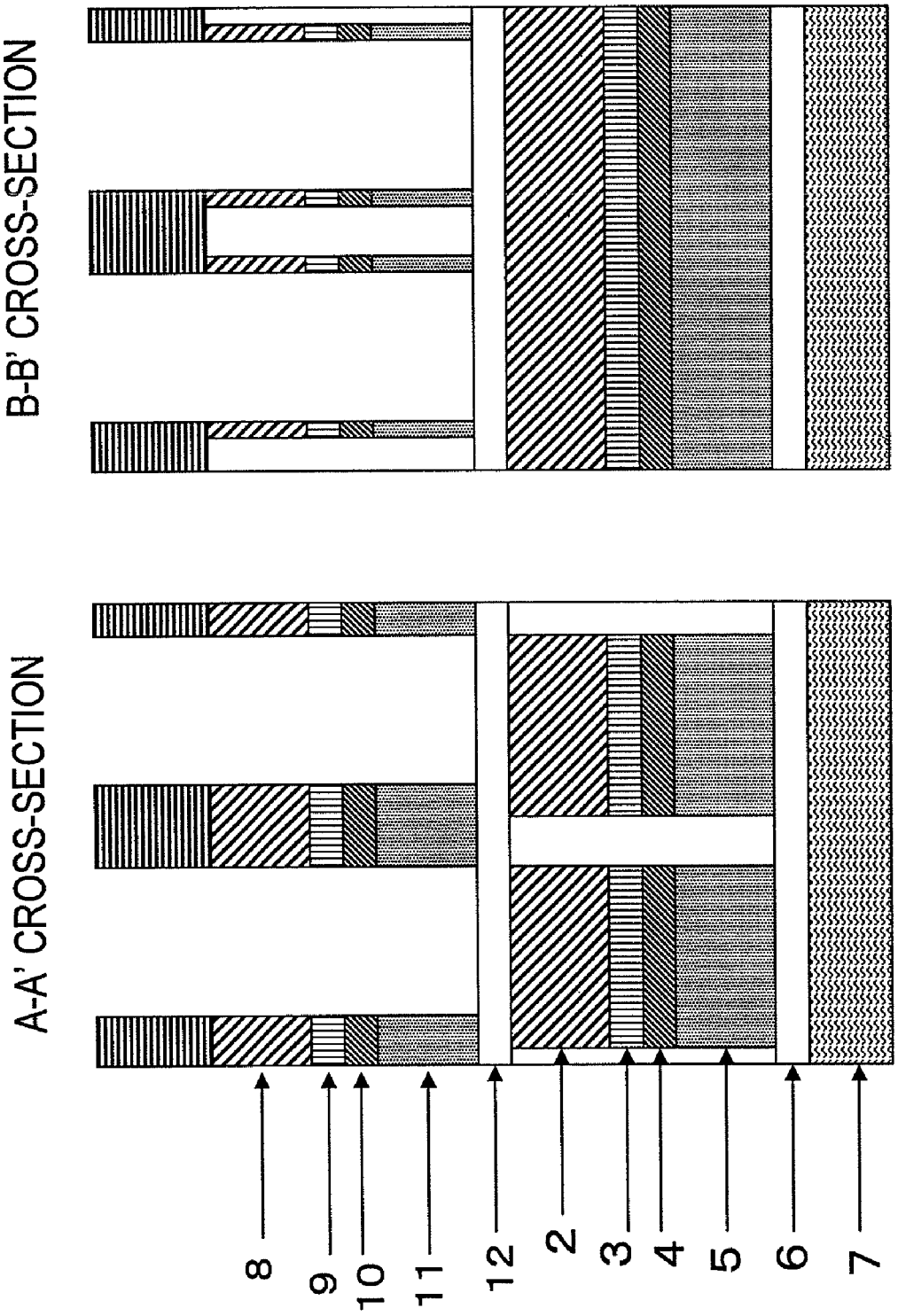
FIG. 7 is still another schematic view illustrating one step of the method for manufacturing the semiconductor device according to the present invention.
Figure 8:
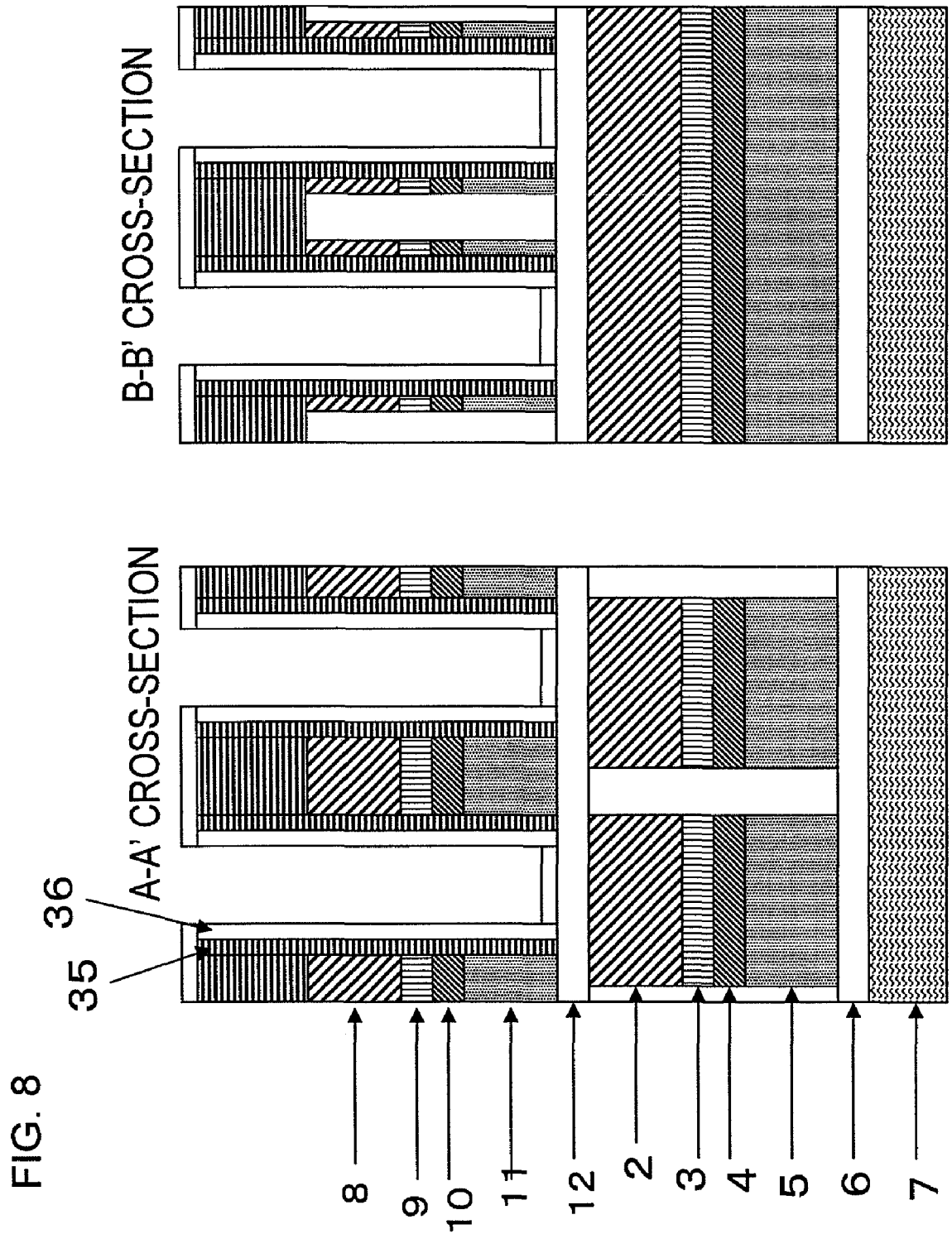
FIG. 8 is still another schematic view illustrating one step of the method for manufacturing the semiconductor device according to the present invention.
Figure 9:
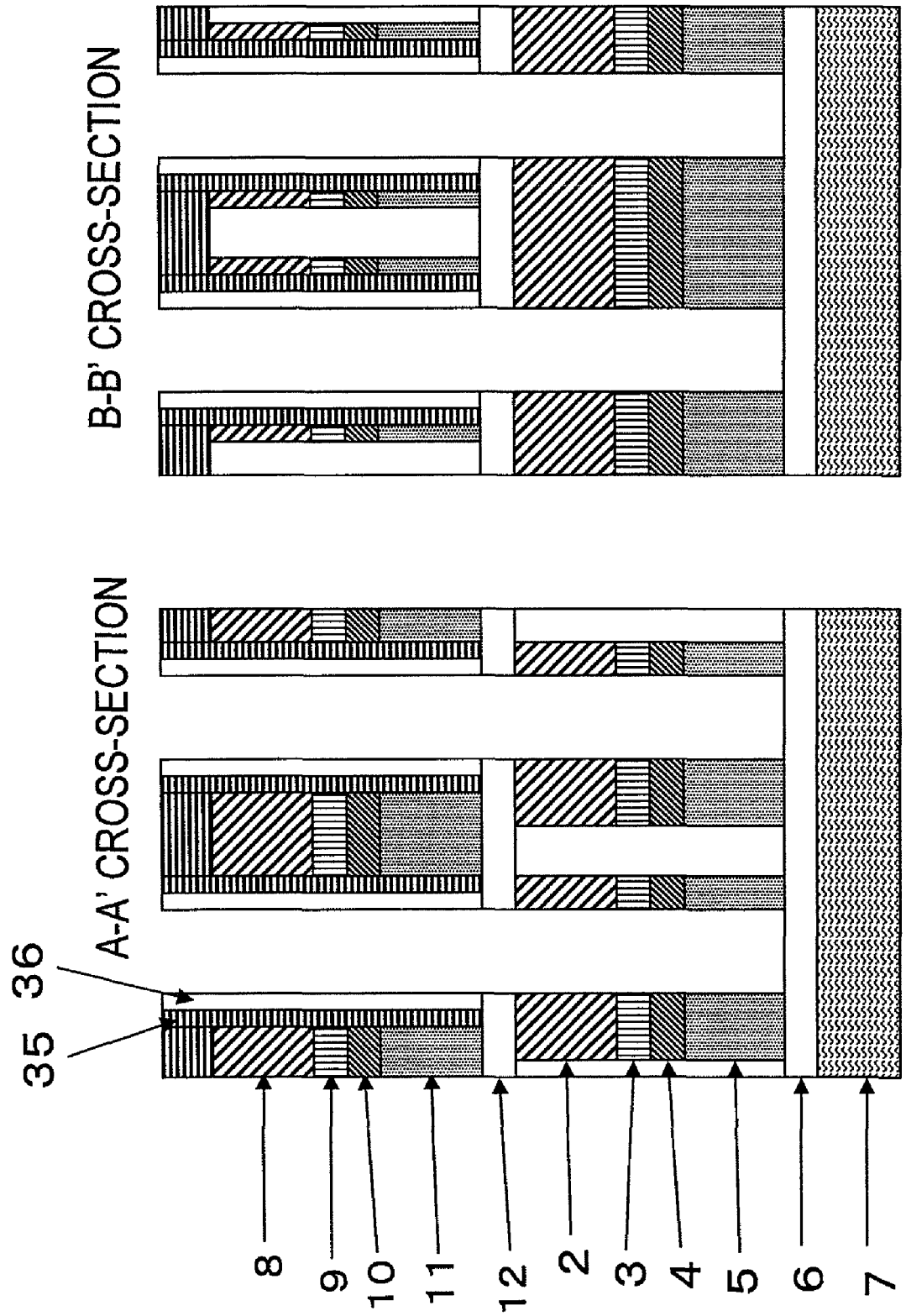
FIG. 9 is still another schematic view illustrating one step of the method for manufacturing the semiconductor device according to the present invention.

After this, there was formed, by lithography, a resist mask (not illustrated) including openings arrayed in the first and second directions. After this, silicon nitride film 34 was dry-etched using this resist mask as a mask, to form an opening within silicon nitride film 34. Then, the resist mask was separated off. After this, silicon nitride film 34 was wet-etched to widen the diameter of the opening within silicon nitride film 34. Next, conductive polysilicon film 8, WSi film 9, WN film 10 and W film 11 were dry-etched using silicon nitride film 34 as a mask and silicon oxide film 12 as an etching stopper (FIG. 7). After this, silicon nitride film 35 was formed on the inner wall of the opening by growing a silicon nitride film and then dry-etching the silicon nitride film. In addition, silicon oxide film 36 was formed on silicon nitride film 35 of the inner wall of the opening (FIG. 8).

Figure 10:
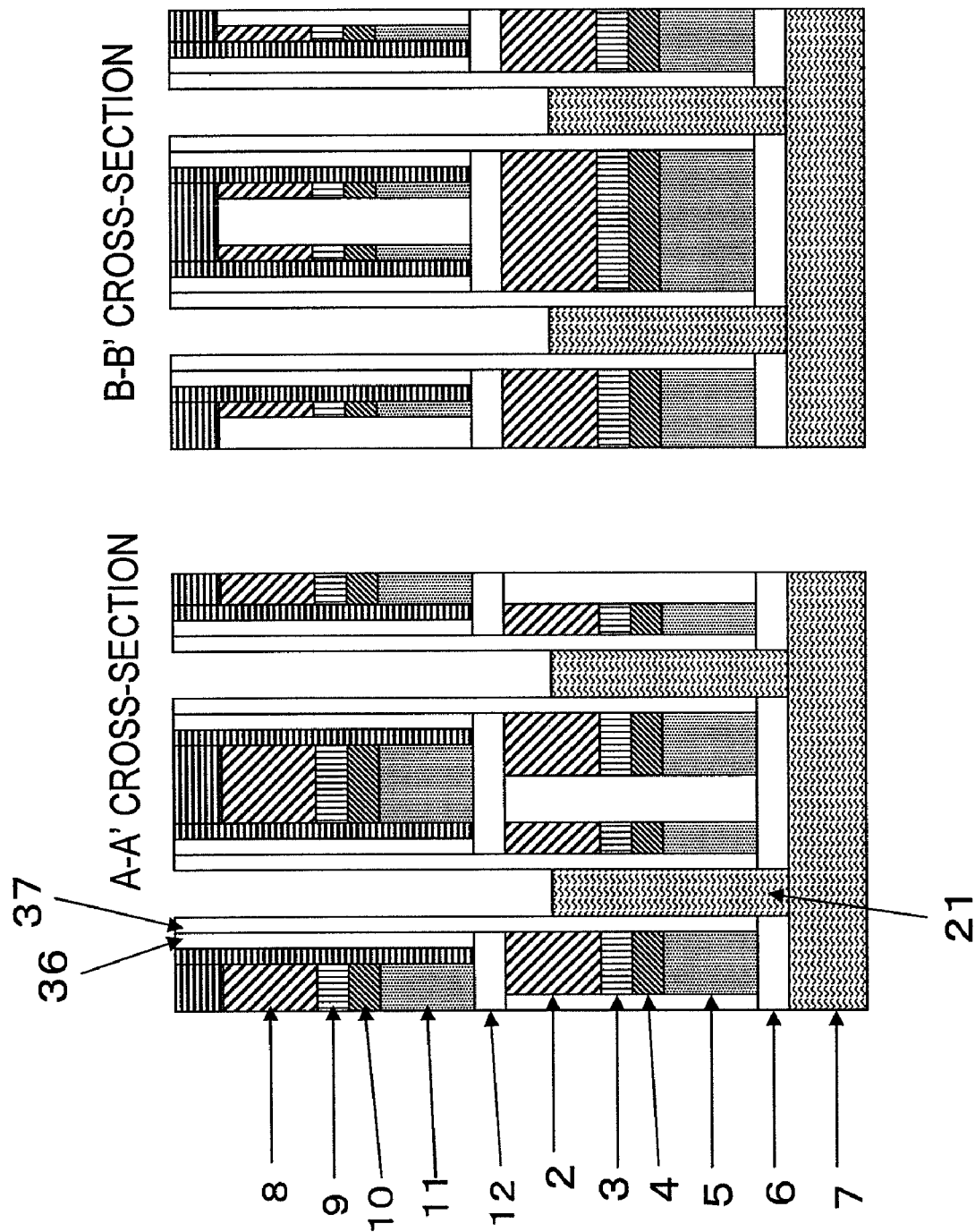
FIG. 10 is still another schematic view illustrating one step of the method for manufacturing the semiconductor device according to the present invention.
Figure 12:
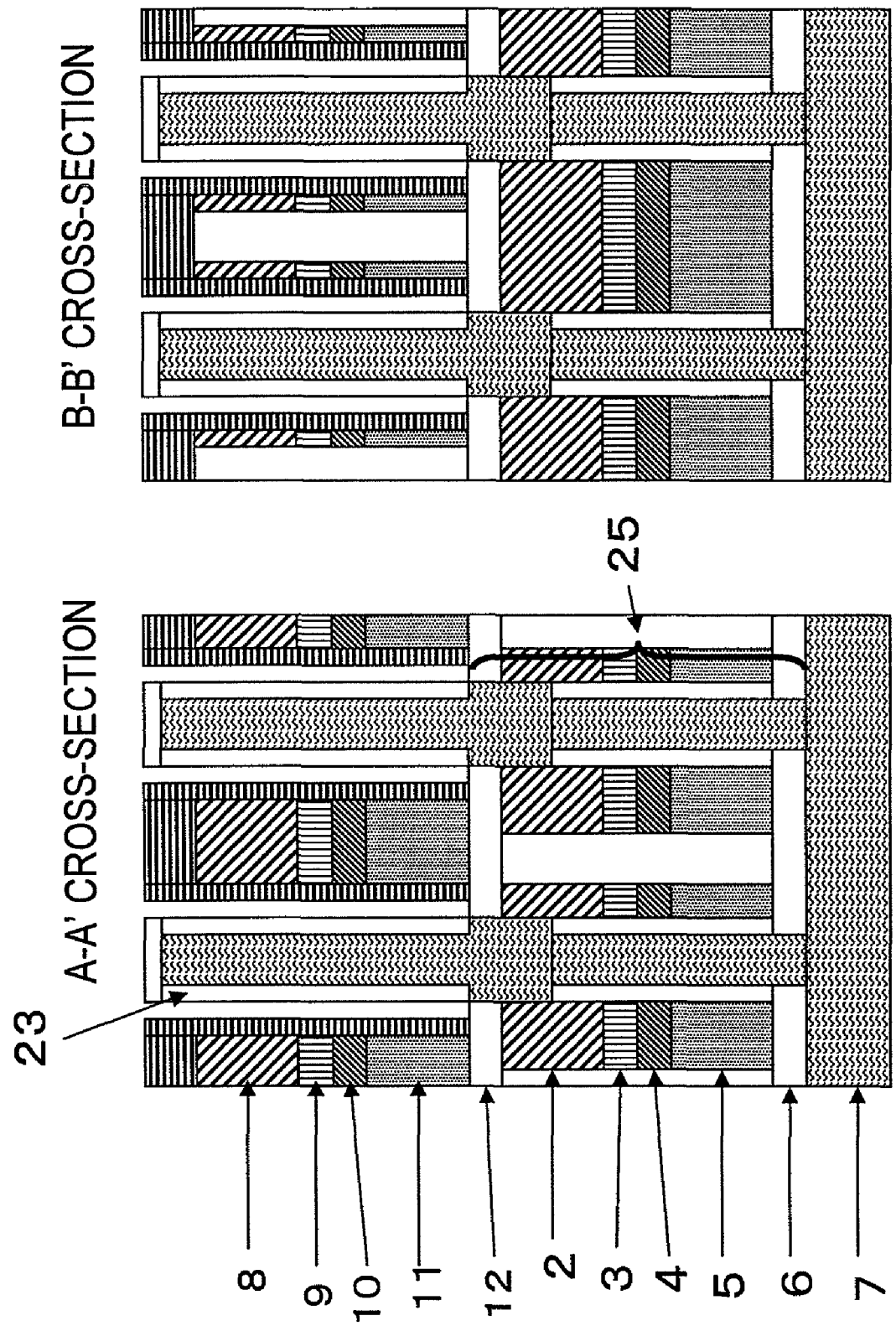
FIG. 12 is still another schematic view illustrating one step of the method for manufacturing the semiconductor device according to the present invention.

After this, silicon oxide film 36, insulating layer 12, conductive polysilicon film 2, WSi film 3, WN film 4 and W film 5 in the bottom face of the opening were dry-etched by anisotropic etching. Thus, the opening was elongated so as to penetrate through these films (FIG. 9; step (4)). After this, silicon oxide film 37 was formed on the inner wall of the opening by depositing a silicon oxide film and then dry-etching the silicon oxide film. Then, the selective epitaxial growth of polysilicon was performed within the opening to form semiconductor region 21. After this, there was implanted an impurity for a first impurity-diffused region (FIG. 10). At this time, it is possible to improve the crystal quality of polysilicon by performing laser annealing or hydrogen annealing after performing the selective epitaxial growth. In particular, it is possible to effectively improve the crystal quality of polysilicon by consecutively performing selective epitaxial growth and a laser annealing process a plural number of times.

After this, exposed silicon oxide film 37 present on part of the inner wall of the opening upper than polysilicon portion 21 formed by selective epitaxial growth was removed by wet-etching the silicon oxide film. Then, after further performing selective epitaxial growth to form polysilicon region 22 on polysilicon portion 21, annealing was performed (FIG. 11). At this time, it is possible to improve the crystal quality of polysilicon by performing laser annealing or hydrogen annealing after performing the selective epitaxial growth. In particular, it is possible to effectively improve the crystal quality of polysilicon by consecutively performing selective epitaxial growth and a laser annealing process a plural number of times.

After this, the impurity for the first impurity-diffused region was implanted, as necessary, into the lower portion of polysilicon region 22 on which selective epitaxial growth had been newly performed. In addition, an impurity for a channel region was implanted into the central part of polysilicon region 22. Accordingly, there were formed a semiconductor region intended to function as the channel region and a portion for first impurity-diffused region 25 (step (5)).

Figure 13:
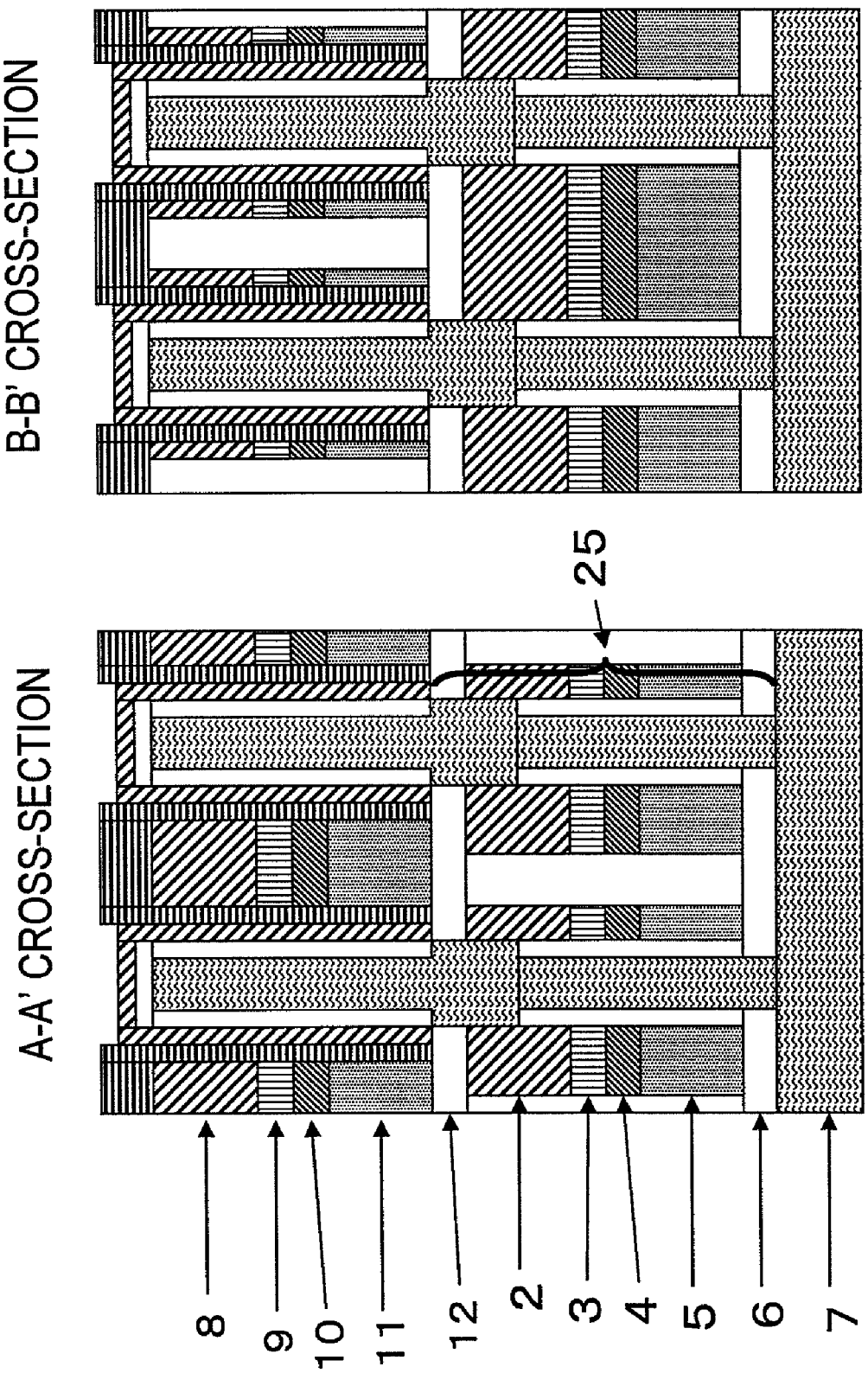
FIG. 13 is still another schematic view illustrating one step of the method for manufacturing the semiconductor device according to the present invention.

After this, silicon oxide film 36 within the opening was wet-etched to expose the side surface of polysilicon region 22. Then, this side surface of polysilicon region 22 was oxidized to form gate insulating film 23 (FIG. 12; step (6)). After this, DOPOS growth was performed to form a conductive polysilicon region on gate insulating film 23 within the opening. This conductive polysilicon region corresponds to second gate electrode material. After this, a CMP treatment was performed to planarize the conductive polysilicon region. Then, the conductive polysilicon region was etched back (FIG. 13).

Figure 14:
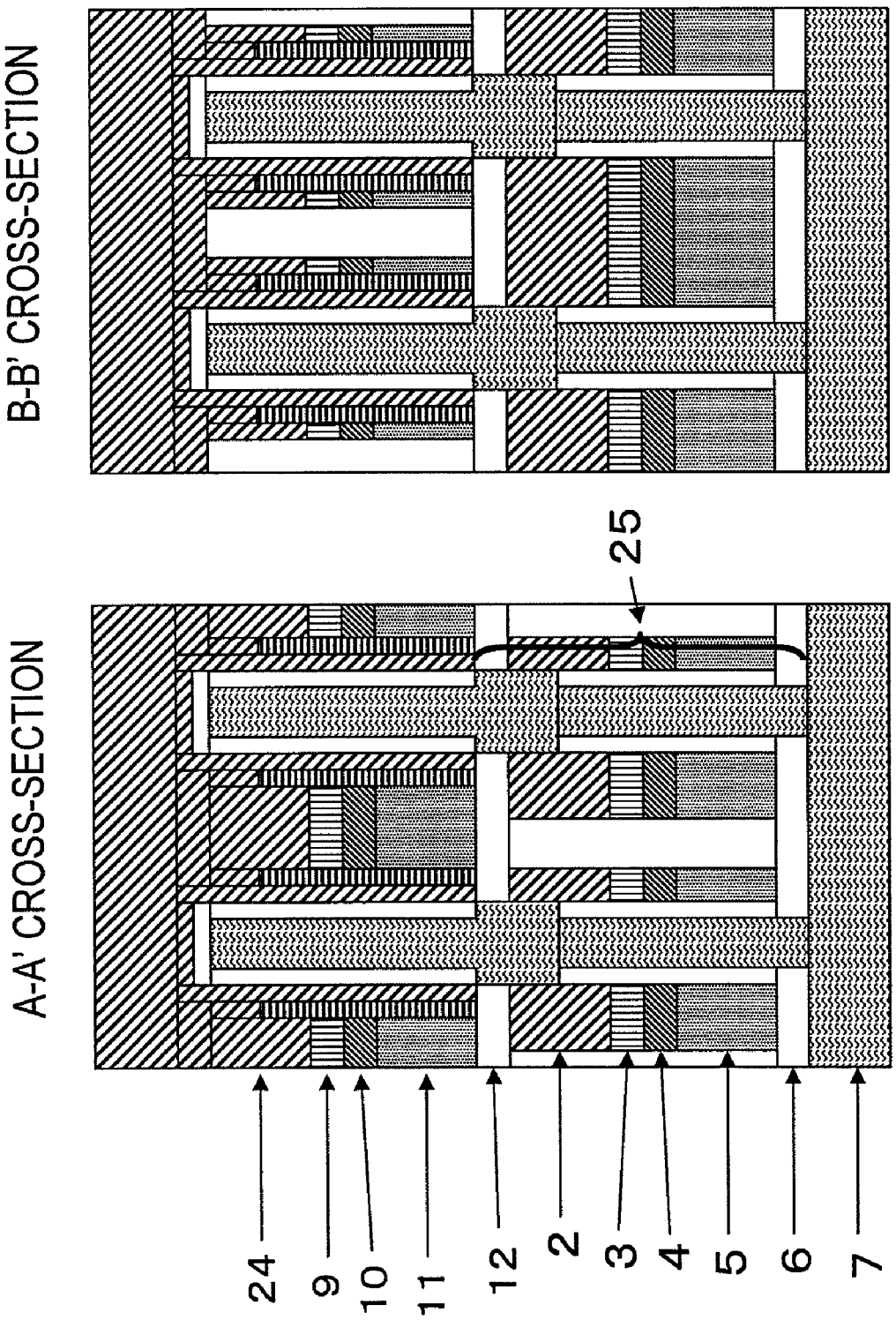
FIG. 14 is still another schematic view illustrating one step of the method for manufacturing the semiconductor device according to the present invention.
Figure 15:
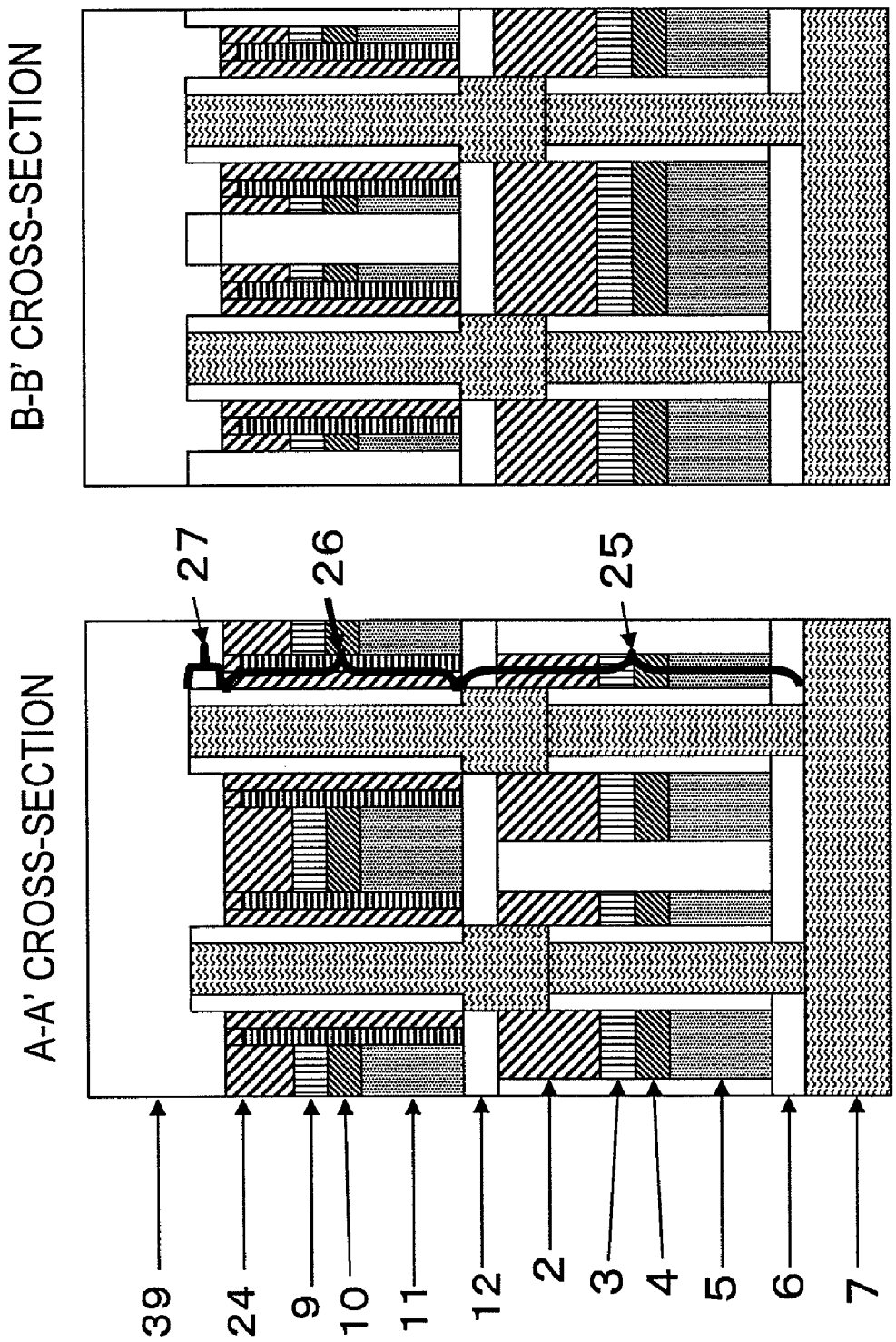
FIG. 15 is still another schematic view illustrating one step of the method for manufacturing the semiconductor device according to the present invention.

After this, the silicon nitride film was wet-etched, so as to be left over between first metal interconnect (denoted by reference numerals 9, 10 and 11) and polysilicon region 22. Consequently, it is possible to prevent first gate electrode material from reacting with a metal material composing first metal interconnect, thus nonuniformly forming a metal silicide, or the constituent material or the like of first metal interconnect from diffusing into the semiconductor region. After this, DOPOS growth was performed on the entire surface of the semiconductor device being manufactured, to additionally form a conductive polysilicon region (FIG. 14). Then, the conductive polysilicon region was etched back so that the uppermost portion thereof was lower than the uppermost portion of polysilicon region 22. By positioning the uppermost portion of the conductive polysilicon region lower than the uppermost portion of polysilicon region 22 in this way, it is possible to secure a large margin for alignment when forming a contact hole in a later step.

As described above, there was formed gate electrode 24 composed of the conductive polysilicon layer and the conductive polysilicon region by forming the conductive polysilicon region (corresponds to second gate electrode material) so as to electrically connect to the conductive polysilicon layer (corresponds to first gate electrode material) previously formed within the opening. In addition, there was obtained a word line composed of this gate electrode 24 and first metal interconnect (denoted by reference numerals 9, 10 and 11) (step (7)).

After this, silicon oxide film 39 was grown on the entire surface of the semiconductor device being manufactured. Next, an impurity was implanted into the upper portion of the polysilicon region, to form second impurity-diffused region 27 (FIG. 15; (step (8))). In this way, first impurity-diffused region 25, semiconductor region 26, and second impurity-diffused region 27 were formed in order from bottom to top.

After this, a resist mask (not illustrated) was formed by lithography, so as to include an opening in a portion thereof corresponding to the second impurity-diffused region. Then, silicon oxide film 39 was dry-etched using this resist mask as a mask, to form contact hole 28. After this, the resist mask was separated off (FIG. 16).

Second Exemplary Embodiment

Semiconductor Device

Figure 18:
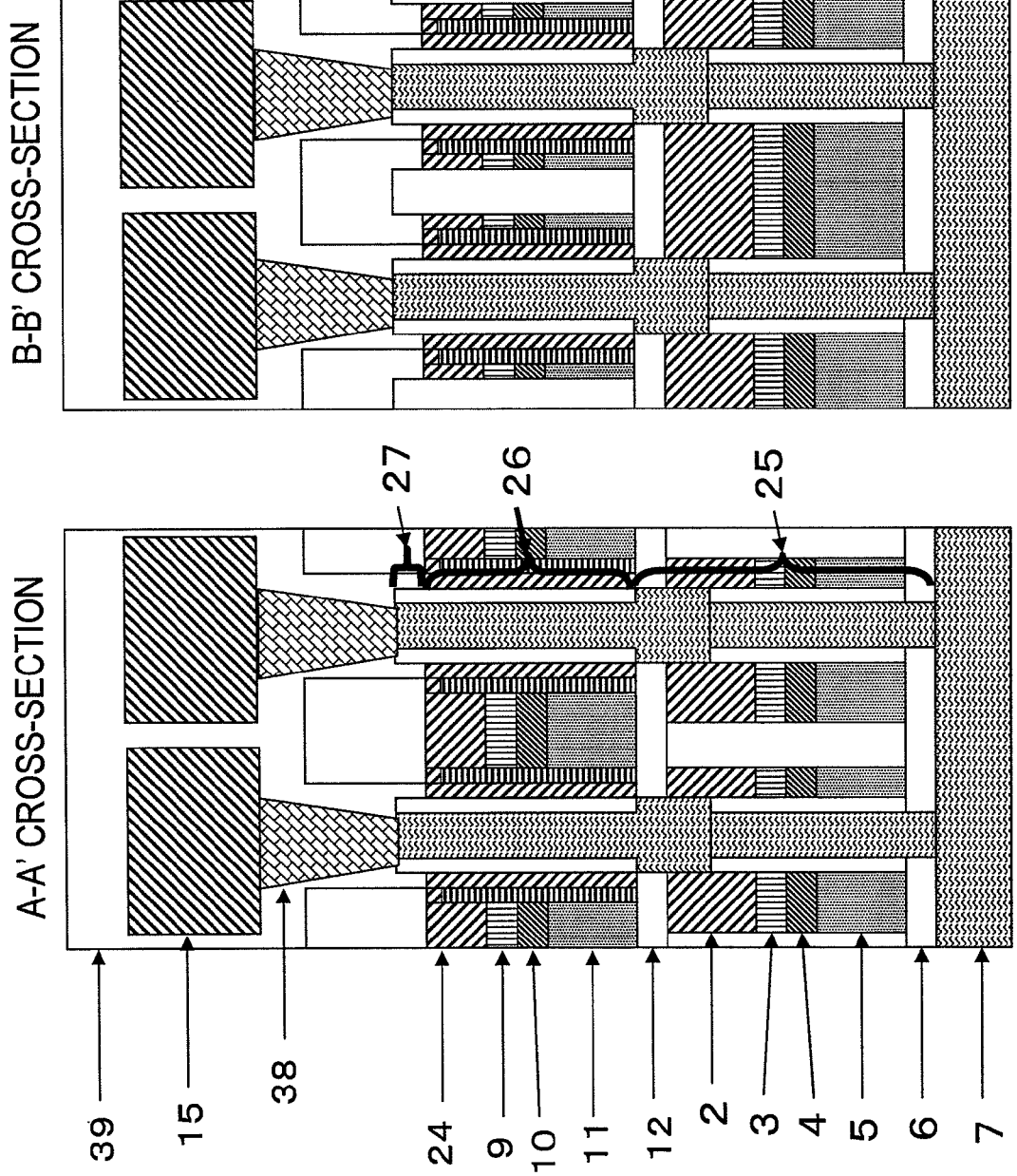
FIG. 18 is a schematic view illustrating another example of the semiconductor device according to the present invention.

FIG. 18 is a schematic view representing the semiconductor device of a second exemplary embodiment. FIG. 18 represents that in the semiconductor device illustrated in FIG. 16, a capacitor or phase-change material 15 is electrically connected to second impurity-diffused region 27 through contact plug 38. As a result of the capacitor or phase-change material 15 being electrically connected to a vertical field effect transistor in this way, one memory cell can be composed of the vertical field effect transistor and the capacitor or phase-change material 15. By including a plurality of such memory cells as described above, the semiconductor device of the present invention can work as a DRAM (Dynamic Random Access Memory) or a PRAM (Phase change Random Access Memory).

The "phase-change material" refers to a material the phase state of which changes according to a voltage or a potential, thereby storing this change in the phase state as information. For example, in a case where a phase-change material which changes into a first phase state and a second phase state is used, it is possible to store the first phase state as a "0" state and the second phase state as a "1" state. As an example of this phase-change material, there can be mentioned chalcogenide (GeAsTe).

Method for Manufacturing Semiconductor Device

In the semiconductor device illustrated in FIG. 18, a vertical field effect transistor and each structural portion were first manufactured in the same way as the steps of FIGS. 1 to 16 in the first exemplary embodiment. After this, interlayer insulating film 39 was formed on the entire surface of the semiconductor device being manufactured. Next, contact plug 38 was formed so as to penetrate through interlayer insulating film 39 and be electrically connected to second impurity-diffused region 27. After this, a capacitor or phase-change material 15 was formed so as to be electrically connected to contact plug 38.

Third Exemplary Embodiment

Semiconductor Device

Figure 19:
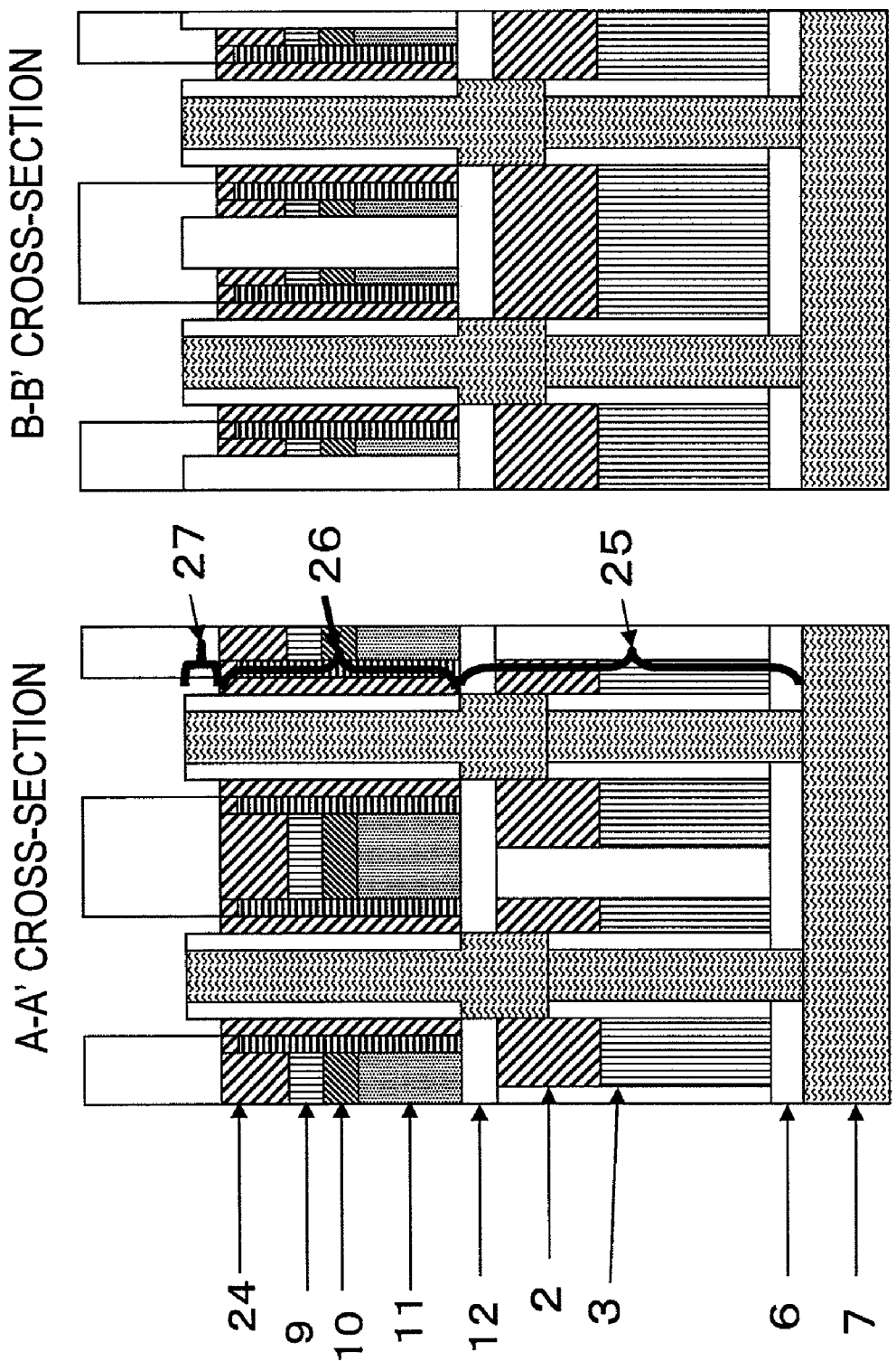
FIG. 19 is a schematic view illustrating yet another example of the semiconductor device according to the present invention.

FIG. 19 is a schematic view representing the semiconductor device of a third exemplary embodiment. The semiconductor device of the third exemplary embodiment differs from the semiconductor device of the first exemplary embodiment in that second metal interconnect is composed of WSi (tungsten silicide) 3. In this way, in the semiconductor device of the present invention, second metal interconnect may be composed only of a metal silicide.

Method for Manufacturing Semiconductor Device

This semiconductor device differs only in that in the first exemplary embodiment, only the growth of WSi layer 3 is performed on the substrate in place of the steps of W layer growth, WN layer growth and WSi layer growth. The rest of the steps can be carried out in the same way as in the first exemplary embodiment. In addition, this WSi layer 3 can be formed by depositing a W (tungsten) film and an Si film, and then letting the films undergo a silicidation reaction by heat treatment.

Fourth Exemplary Embodiment

Semiconductor Device

Figure 20:
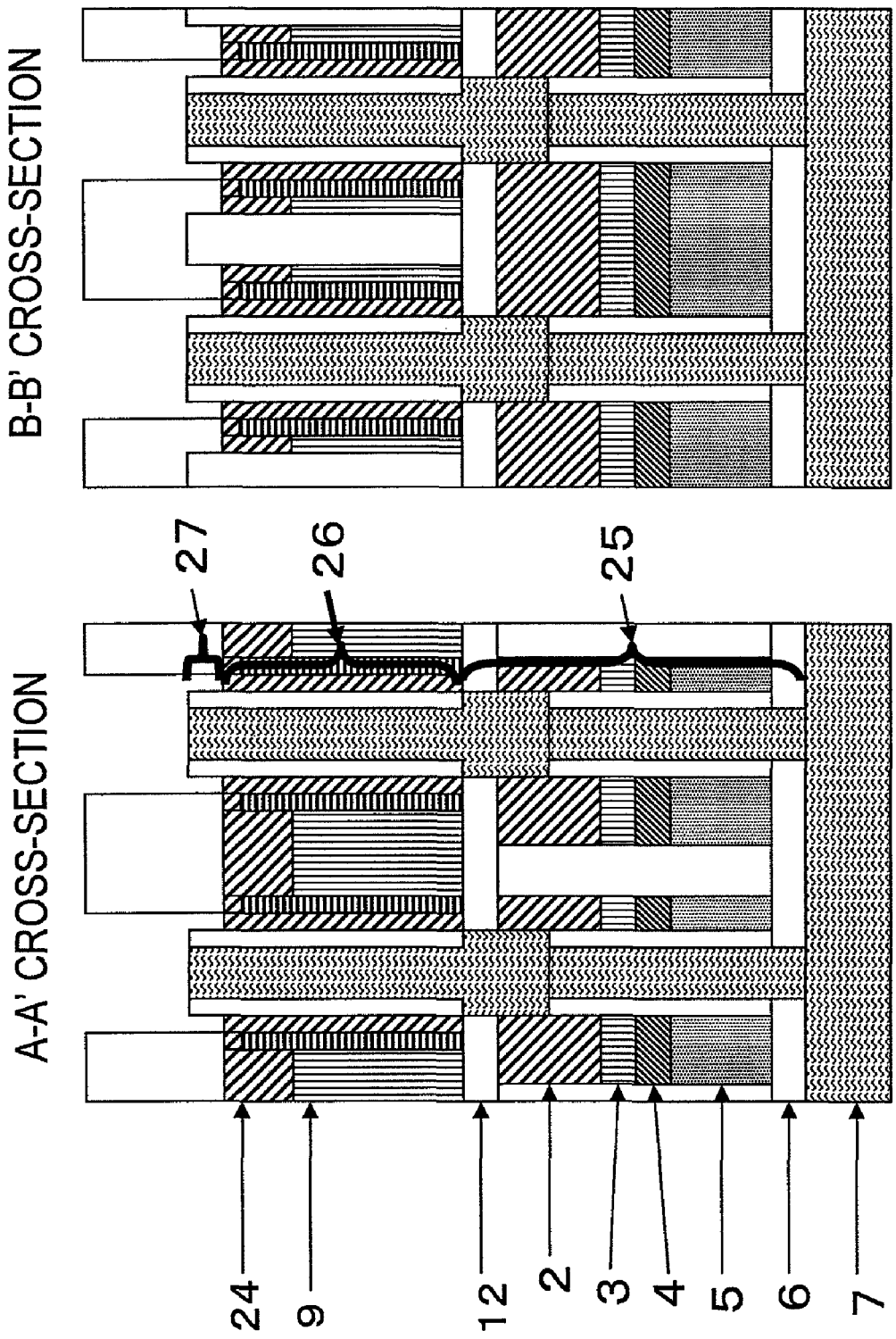
FIG. 20 is a schematic view illustrating still another example of the semiconductor device according to the present invention.

FIG. 20 is a schematic view representing the semiconductor device of a fourth exemplary embodiment. The semiconductor device of the fourth exemplary embodiment differs from the semiconductor device of the first exemplary embodiment in that first metal interconnect is composed of WSi (tungsten silicide) 9. In this way, in the semiconductor device of the present invention, first metal interconnect may be composed only of a metal silicide.

Method for Manufacturing Semiconductor Device

This semiconductor device differs only in that in the first exemplary embodiment, only the growth of WSi layer 9 is performed on the insulating layer in place of the steps of W layer growth, WN layer growth and WSi layer growth. The rest of the steps can be carried out in the same way as in the first exemplary embodiment. In addition, this WSi layer can be formed by depositing a W (tungsten) film and an Si film, and then letting the films undergo a silicidation reaction by heat treatment.

Fifth Exemplary Embodiment

Semiconductor Device

FIG. 21 is a schematic view representing the semiconductor device of a fifth exemplary embodiment. The semiconductor device of the fifth exemplary embodiment differs from the semiconductor device of the first exemplary embodiment in that first and second metal interconnects are composed of WSi (tungsten silicides) 3 and 9. In this way, in the semiconductor device of the present invention, first and second metal interconnects may be composed only of a metal silicide.

Method for Manufacturing Semiconductor Device

This semiconductor device differs only in that in the first exemplary embodiment, only the growth of WSi layer is performed on the substrate in place of the steps of W layer growth, WN layer growth and WSi layer growth. The rest of the steps can be carried out in the same way as in the first exemplary embodiment.

It is apparent that the present invention is not limited to the above embodiments, but may be modified and changed without departing from the scope and spirit of the invention.

What is claimed is:

1. A semiconductor device, comprising:
    a vertical field effect transistor;
    a word line; and
    a bit line,
    wherein the vertical field effect transistor includes a first impurity-diffused region, a semiconductor region, and a second impurity-diffused region in this order, and includes a gate electrode formed so as to cover at least part of the side surface of the semiconductor region and a gate insulating film formed between the gate electrode and the semiconductor region,
    the word line includes (a) the gate electrode, and (b) a first metal interconnect having contact with the gate electrode and extending into a region upper than the first impurity-diffused region in a first direction, and
    the bit line includes (c) a connecting part formed so as to have contact with at least part of the side surface of the first impurity-diffused region, and (d) a second metal interconnect having contact with the connecting part and extending into a region lower than the semiconductor region in a second direction orthogonal to the first direction.

2. The semiconductor device according to claim 1, comprising a plurality of vertical field effect transistors arrayed in the first and second directions,
    wherein the first metal interconnect electrically connects the gate electrodes of the plurality of vertical field effect transistors arrayed in the first direction, and the bit line electrically connects the first impurity-diffused regions of the plurality of vertical field effect transistors arrayed in the second direction.

3. The semiconductor device according to claim 1,
    wherein the gate electrode comprises a polysilicon, and the gate electrode and a top surface of the first metal interconnect are connected by the polysilicon.

4. The semiconductor device according to claim 1,
    wherein the first metal interconnect is composed of, in order from the bottom thereof, a W (tungsten) layer, a WN (tungsten nitride) layer and a metal silicide layer.

5. The semiconductor device according to claim 1,
    wherein the connecting part is composed of conductive polysilicon, a metal or a metal silicide.

6. The semiconductor device according to claim 1,
    wherein the second metal interconnect is composed of a metal, a metal silicide, or a laminated structure comprised of the metal and the metal silicide.

7. The semiconductor device according to claim 1,
    wherein the second metal interconnect is composed of, in order from the bottom thereof, a W (tungsten) layer, a WN (tungsten nitride) layer and a metal silicide layer.

8. The semiconductor device according to claim 1, further comprising a capacitor electrically connected to the second impurity-diffused region,
    wherein the vertical field effect transistor and the capacitor comprise a memory cell.

9. The semiconductor device according to claim 1, further comprising a memory element including a phase-change material,
    wherein the memory element is electrically connected to the second impurity-diffused region, and
    the vertical field effect transistor and the memory element comprise a memory cell.

10. The semiconductor device according to claim 3, wherein the first metal interconnect comprises a metal silicide, the metal silicide being at least one type of silicide selected from the group consisting of a tungsten silicide, a cobalt silicide, a nickel silicide, a titanium silicide, a molybdenum silicide and a chromium silicide.

11. A semiconductor device, comprising:
a semiconductor substrate;
a vertical field effect transistor formed on the semiconductor substrate,
wherein the vertical field effect transistor comprises a first impurity-diffused region, a channel region, and a second impurity-diffused region in this order from a top surface of the semiconductor substrate, and a gate electrode disposed facing to a side surface of the channel region with an intervention of a gate insulating film therebetween;
a word line including the gate electrode and a first metal interconnect having contact with the gate electrode, wherein the first metal interconnect is disposed facing to a side surface of the gate electrode with an intervention of an insulating film therebetween, and the word line extends in a first direction, and a level of the word line from the top surface of the semiconductor substrate is higher than a top surface of the first impurity-diffused region; and
a bit line including a second metal interconnect and a connecting part for contacting with the first impurity-diffused region, wherein the second metal interconnect contacts with the connecting part, the second metal interconnect is disposed facing to a side surface of the first impurity-diffused region with an intervention of an insulating film therebetween, the bit line extends in a second direction orthogonal to the first direction, and a level of the bit line from the top surface of the semiconductor substrate is lower than a bottom surface of the channel region.

12. The semiconductor device according to claim 11, wherein the gate electrode comprises a polysilicon, and the gate electrode and a top surface of the first metal interconnect are connected by the polysilicon.

13. The semiconductor device according to claim 11, wherein at least one of the first metal interconnect and the second metal interconnect comprises a W (tungsten) layer, a WN (tungsten nitride) layer and a metal silicide layer in order from the bottom layer thereof.

14. A method for manufacturing a semiconductor device including a vertical field effect transistor, the method comprising:
(1) forming a bit line including a second metal interconnect and a connecting part in this order on a substrate so as to extend in a second direction;
(2) forming an insulating layer on the entire surface of the substrate;
(3) forming a first metal interconnect and a first gate electrode material in this order on the insulating layer so as to extend in a first direction orthogonal to the second direction;
(4) forming an opening so as to penetrate the first gate electrode material, the first metal interconnect, the insulating layer, the connecting part and the second metal interconnect through to the substrate;
(5) forming a first impurity-diffused region within the opening so as to be electrically connected to the connecting part, and a semiconductor region on the first impurity-diffused region;
(6) forming a gate insulating film on a side surface of the semiconductor region within the opening;
(7) forming a gate electrode made of the first gate electrode material and a second gate electrode material by forming the second gate electrode material on the gate insulating film within the opening so as to be electrically connected to the first gate electrode material, and obtaining a word line composed of the gate electrode and the first metal interconnect; and
(8) converting an upper portion of the semiconductor region into a second impurity-diffused region.

15. The method for manufacturing a semiconductor device according to claim 14, wherein in the step (4), a plurality of the openings arrayed in the first and second directions are formed and a plurality of vertical field effect transistors are formed.

16. The method for manufacturing a semiconductor device according to claim 14, wherein the first metal interconnect is composed of, in order from the bottom thereof, a W (tungsten) layer, a WN (tungsten nitride) layer and a metal silicide layer.

17. The method for manufacturing a semiconductor device according to claim 14, wherein the second metal interconnect is composed of, in order from the bottom thereof, a W (tungsten) layer, a WN (tungsten nitride) layer and a metal silicide layer.

18. The method for manufacturing a semiconductor device according to claim 14, wherein in the step (5), at least one of the first impurity diffused region and the semiconductor region is formed by selective epitaxial growth.

19. The method for manufacturing a semiconductor device according to claim 14, after the step (8), further comprising:
forming an interlayer insulating film over the entire surface of the substrate;
forming a contact plug so as to penetrate through the interlayer insulating film and be electrically connected to the second impurity-diffused region; and
forming a capacitor so as to be electrically connected to the contact plug.

20. The method for manufacturing a semiconductor device according to claim 18, wherein laser annealing or hydrogen annealing is performed after the selective epitaxial growth.

* * * * *